US011227833B2

(12) United States Patent
Lee et al.

(10) Patent No.: US 11,227,833 B2
(45) Date of Patent: Jan. 18, 2022

(54) INTERCONNECT STRUCTURE AND METHOD FOR FORMING THE SAME

(71) Applicant: TAIWAN SEMICONDUCTOR MANUFACTURING, CO., LTD., Hsinchu (TW)

(72) Inventors: Shao-Kuan Lee, Kaohsiung (TW); Cheng-Chin Lee, Taipei (TW); Hsin-Yen Huang, New Taipei (TW); Hai-Ching Chen, Hsinchu (TW); Shau-Lin Shue, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 4 days.

(21) Appl. No.: 16/571,825

(22) Filed: Sep. 16, 2019

(65) Prior Publication Data
US 2021/0082814 A1    Mar. 18, 2021

(51) Int. Cl.
*H01L 23/52*     (2006.01)
*H01L 23/528*    (2006.01)
(Continued)

(52) U.S. Cl.
CPC .... *H01L 23/5283* (2013.01); *H01L 21/32133* (2013.01); *H01L 21/32139* (2013.01);
(Continued)

(58) Field of Classification Search
CPC ........... H01L 23/5226; H01L 29/66795; H01L 21/76816; H01L 23/5283; H01L 21/76877; H01L 29/785; H01L 21/76885; H01L 21/32139; H01L 21/76837; H01L 21/76883; H01L 21/76802; H01L 21/76897; H01L 21/32133; H01L 23/5389; H01L 24/18; H01L 24/19; H01L 24/20; H01L 24/23; H01L 24/24; H01L 24/25; H01L 2224/21; H01L 2224/23;
(Continued)

(56) References Cited

U.S. PATENT DOCUMENTS 6,255,151 B1 * 7/2001 Fukuda ................... H01L 28/40
                                                           438/197
6,287,958 B1 * 9/2001 Reinberg .......... H01L 21/76829
                                                          257/E21.576
(Continued)

FOREIGN PATENT DOCUMENTS

KR        20190055395 A  *  5/2019   ....... H01L 21/76816

*Primary Examiner* — Samuel Park
(74) *Attorney, Agent, or Firm* — Birch, Stewart, Kolasch & Birch, LLP

(57) ABSTRACT

A method for forming an interconnect structure is provided. The method for forming the interconnect structure includes forming a first dielectric layer over a substrate, forming a first conductive feature through the first dielectric layer, forming a first blocking layer on the first conductive feature, forming a first etching stop layer over the first dielectric layer and exposing the first blocking layer, removing at least a portion of the first blocking layer, forming a first metal bulk layer over the first etching stop layer and the first conductive feature, and etching the first metal bulk layer to form a second conductive feature electrically connected to the first conductive feature.

20 Claims, 21 Drawing Sheets

(51) Int. Cl.
*H01L 21/3213* (2006.01)
*H01L 21/768* (2006.01)
*H01L 23/522* (2006.01)

(52) U.S. Cl.
CPC .. *H01L 21/76802* (2013.01); *H01L 21/76837* (2013.01); *H01L 21/76877* (2013.01); *H01L 21/76883* (2013.01); *H01L 21/76885* (2013.01); *H01L 21/76897* (2013.01); *H01L 23/5226* (2013.01)

(58) Field of Classification Search
CPC ........... H01L 2224/24; H01L 2224/766; H01L 2224/821; H01L 21/8226; H01L 21/823; H01L 27/02; H01L 27/14636; H01L 29/08; H01L 29/10; H01L 29/1037; H01L 29/41766; H01L 29/41775; H01L 29/4236; H01L 29/458; H01L 2027/11866
See application file for complete search history.

(56) References Cited

U.S. PATENT DOCUMENTS

| | | | |
|---|---|---|---|
| 8,193,087 B2* | 6/2012 | Shih | H01L 21/76883 438/634 |
| 2003/0089928 A1* | 5/2003 | Saito | H01L 21/76834 257/213 |
| 2006/0046518 A1* | 3/2006 | Hill | C23C 16/45525 438/778 |
| 2008/0197393 A1* | 8/2008 | Kim | H01L 27/10876 257/298 |
| 2015/0349023 A1* | 12/2015 | Debord | H01L 21/76816 257/252 |
| 2016/0118335 A1* | 4/2016 | Lee | H01L 21/76831 257/774 |
| 2019/0148289 A1* | 5/2019 | Seo | H01L 21/76816 257/774 |
| 2019/0305098 A1* | 10/2019 | Ahn | H01L 29/41791 |

* cited by examiner

INTERCONNECT STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
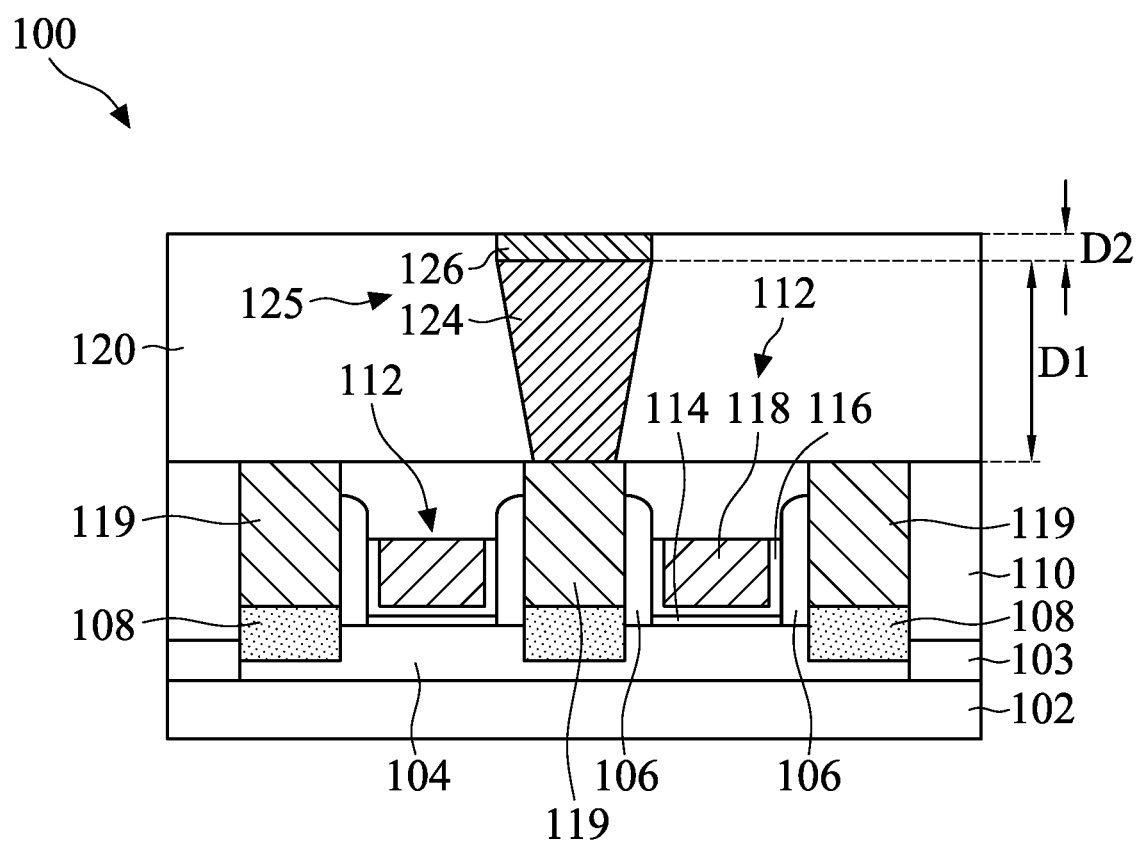
FIGS. 1A-1P are cross-sectional views illustrating the formation of a semiconductor device at various intermediate stages, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of a method for forming an interconnect structure of a semiconductor device are provided. The method may include forming a via through a dielectric layer, forming a blocking layer over the via, forming a self-aligned etching stop layer covering the dielectric layer and exposing the via, forming a metal bulk layer over the self-aligned etching stop layer and the via, and etching the metal bulk layer to form a metal line electrically connecting the via. Because the self-aligned etching stop layer may function as a glue layer to adhere the metal bulk layer to the dielectric layer, it is not necessary to form a conductive glue layer before metal bulk layer. Therefore, the metal bulk layer of the metal line may directly contact the underlying via, thereby reducing the resistance of the multilayer interconnect structure.

Figure 1B:
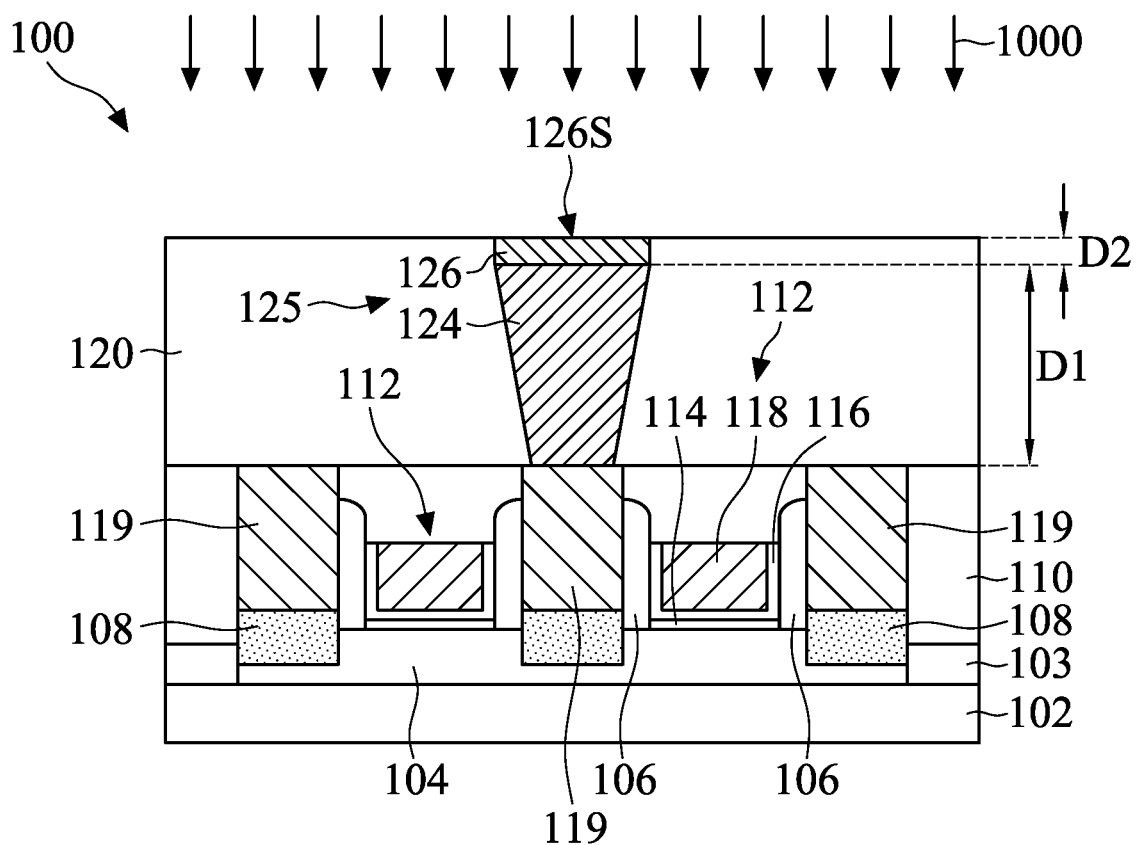
Figure 1C:
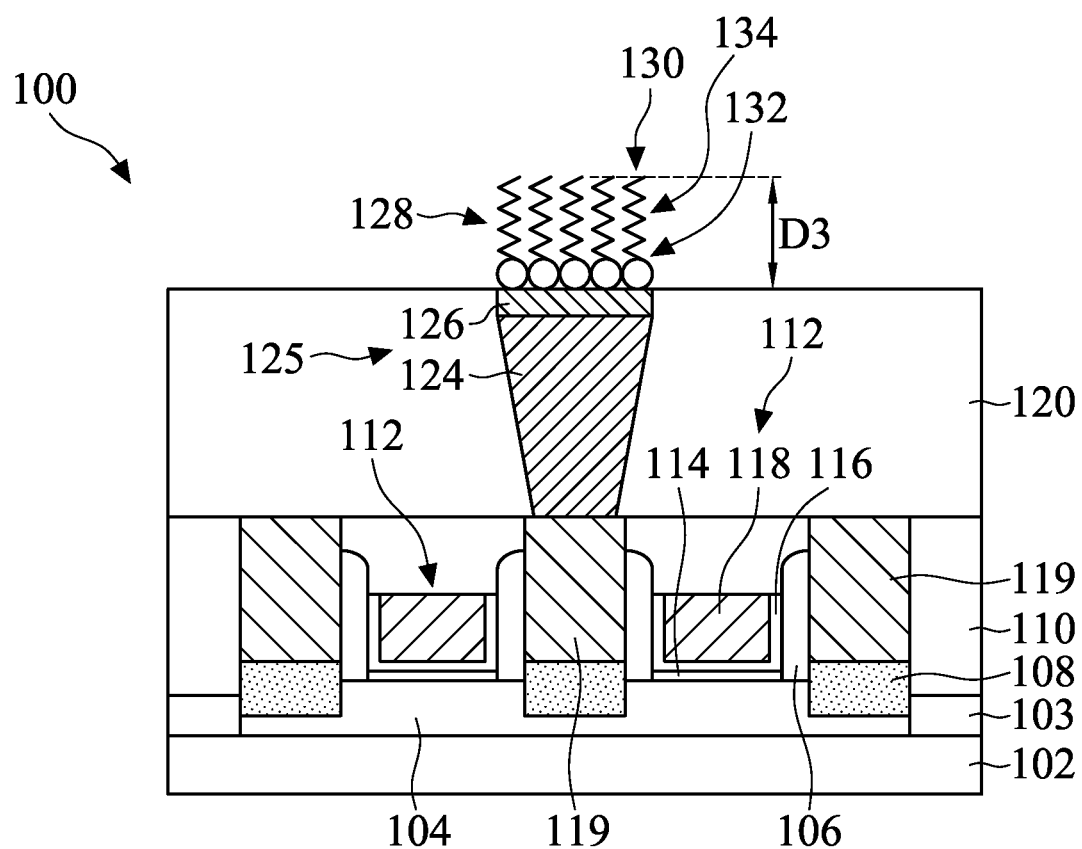
Figure 1D:
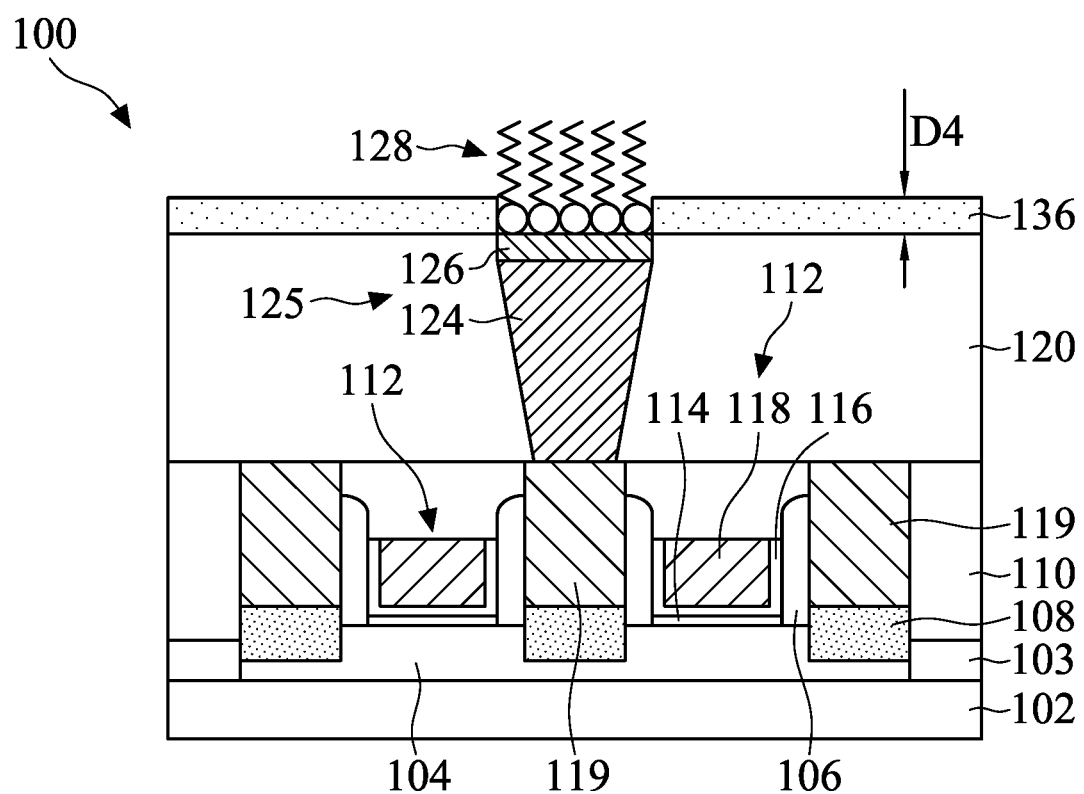
Figure 1E:
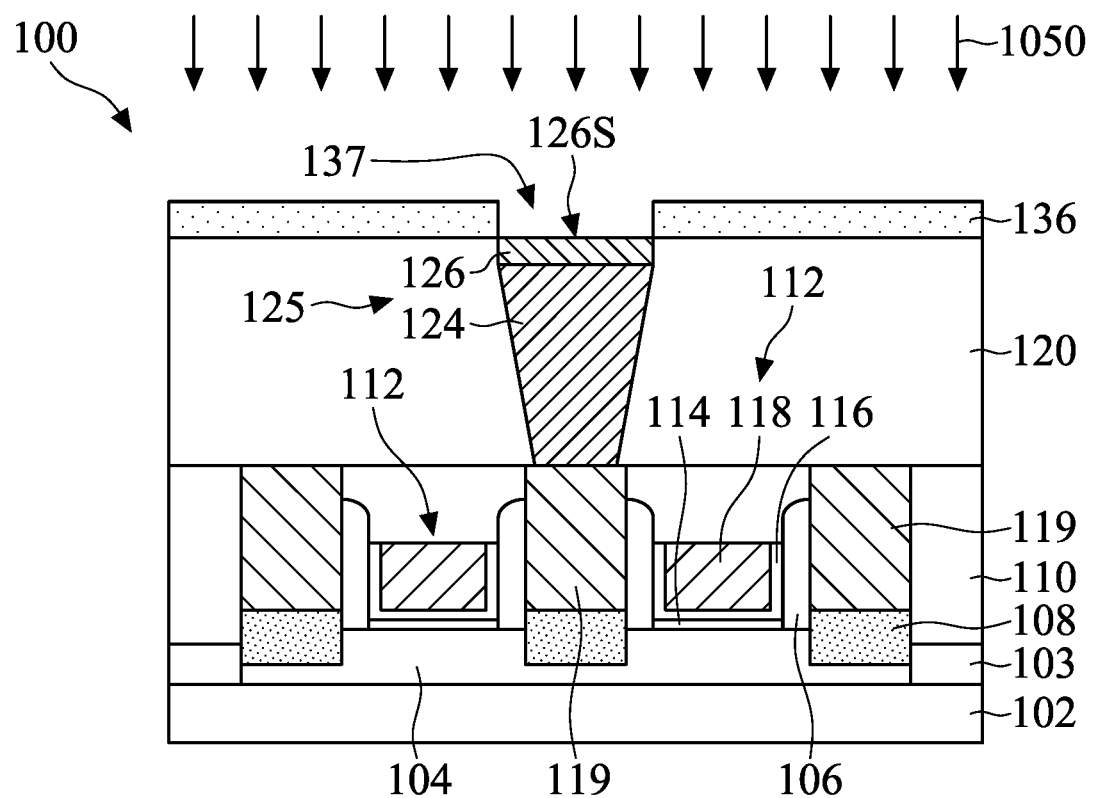
Figure 1F:
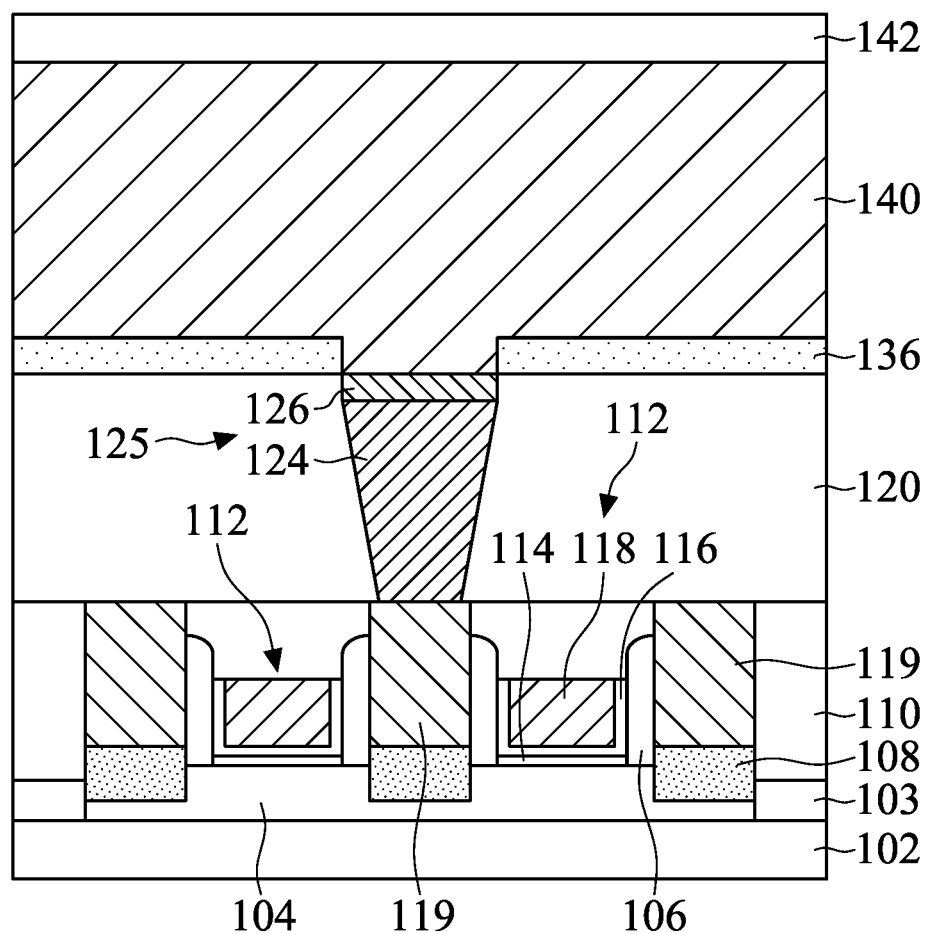
Figure 1G:
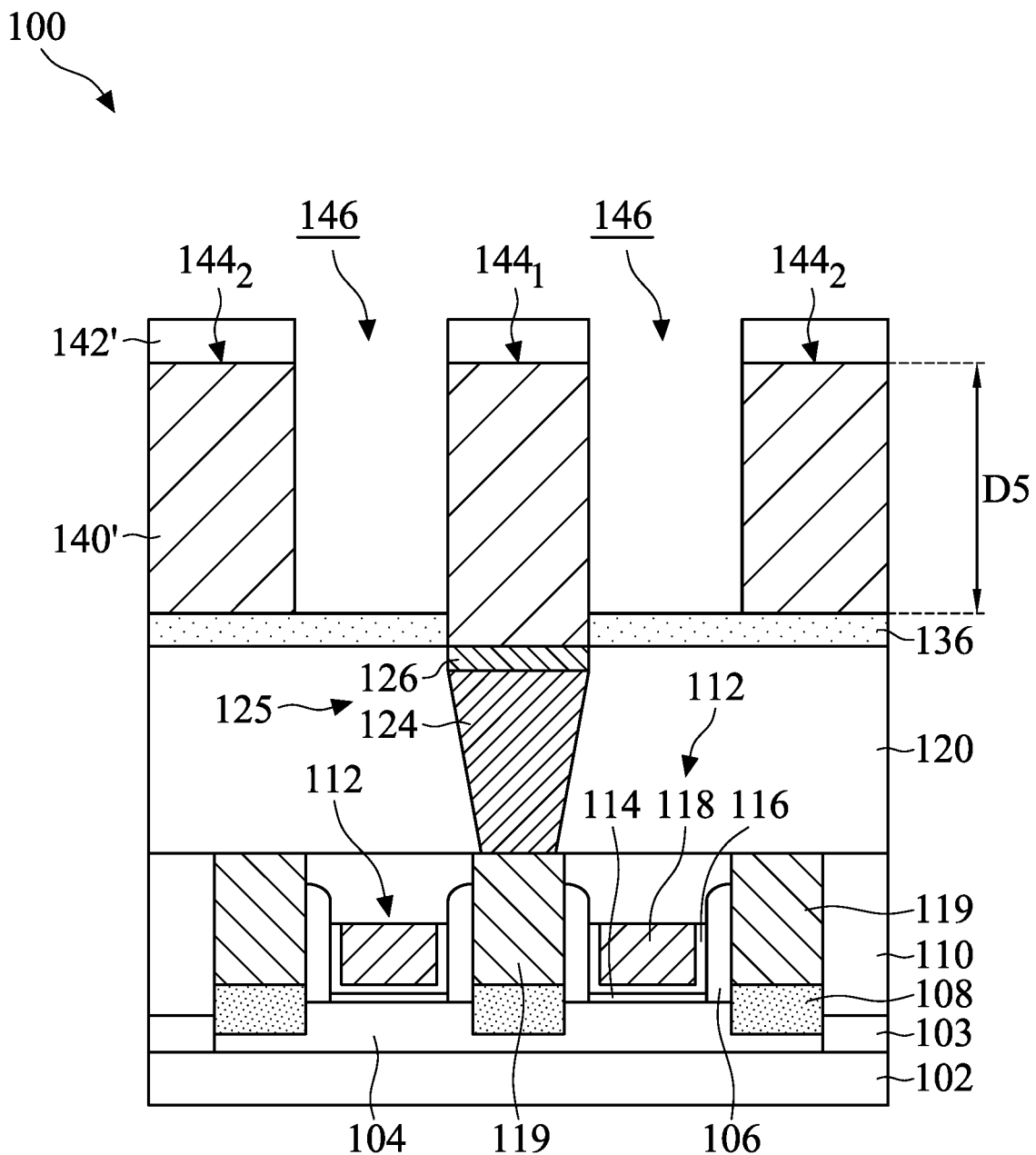
Figure 1H:
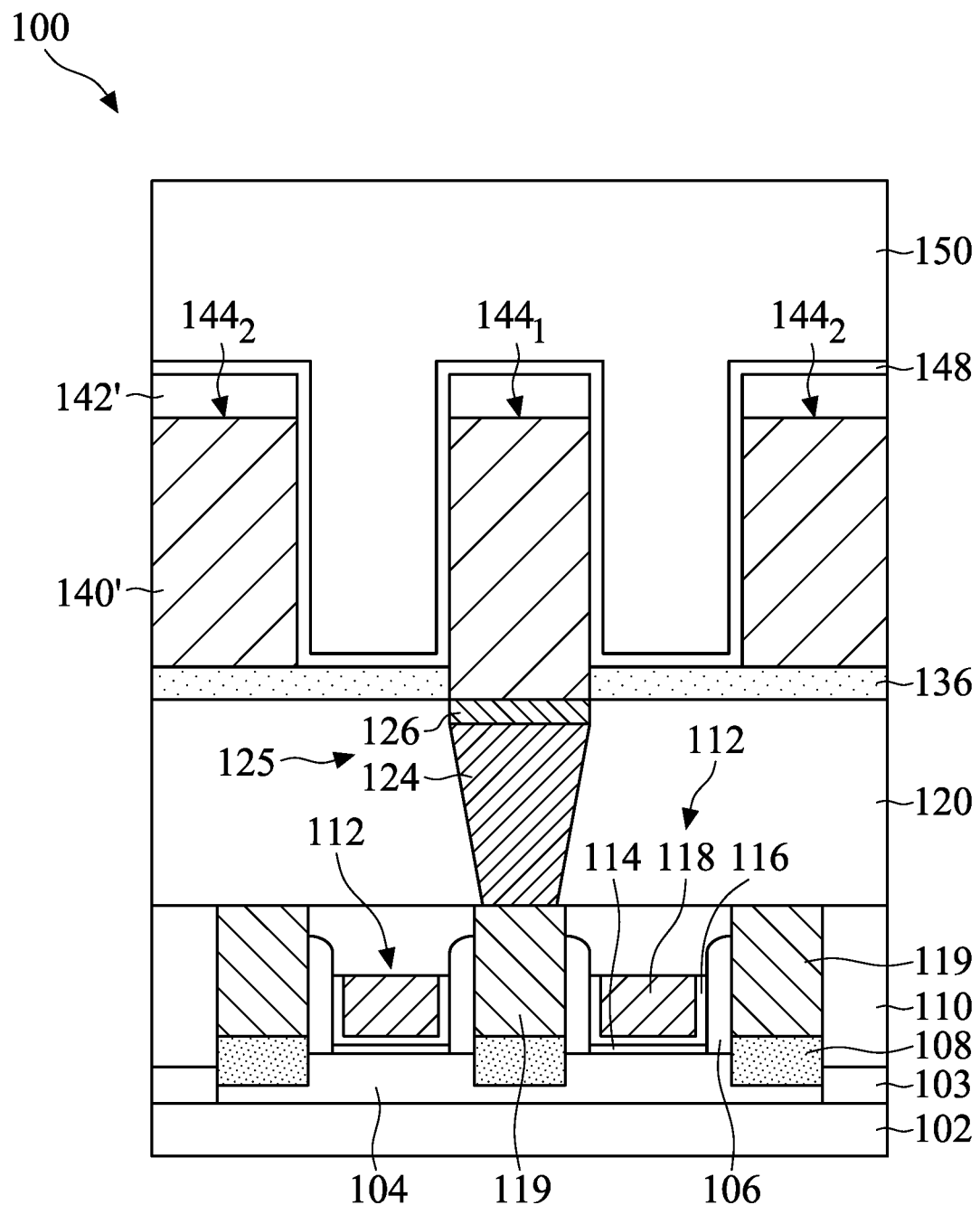
Figure 1I:
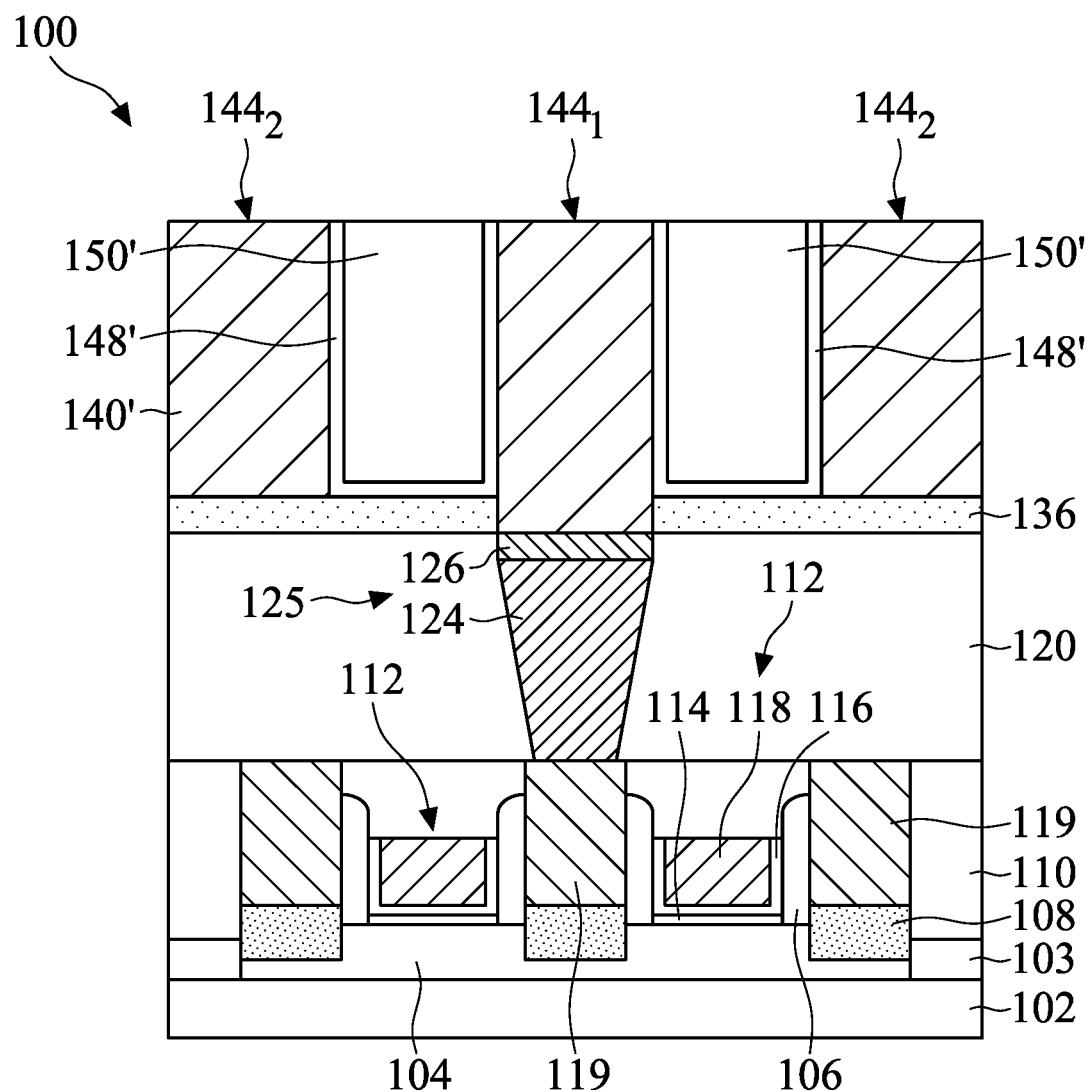
Figure 1J:
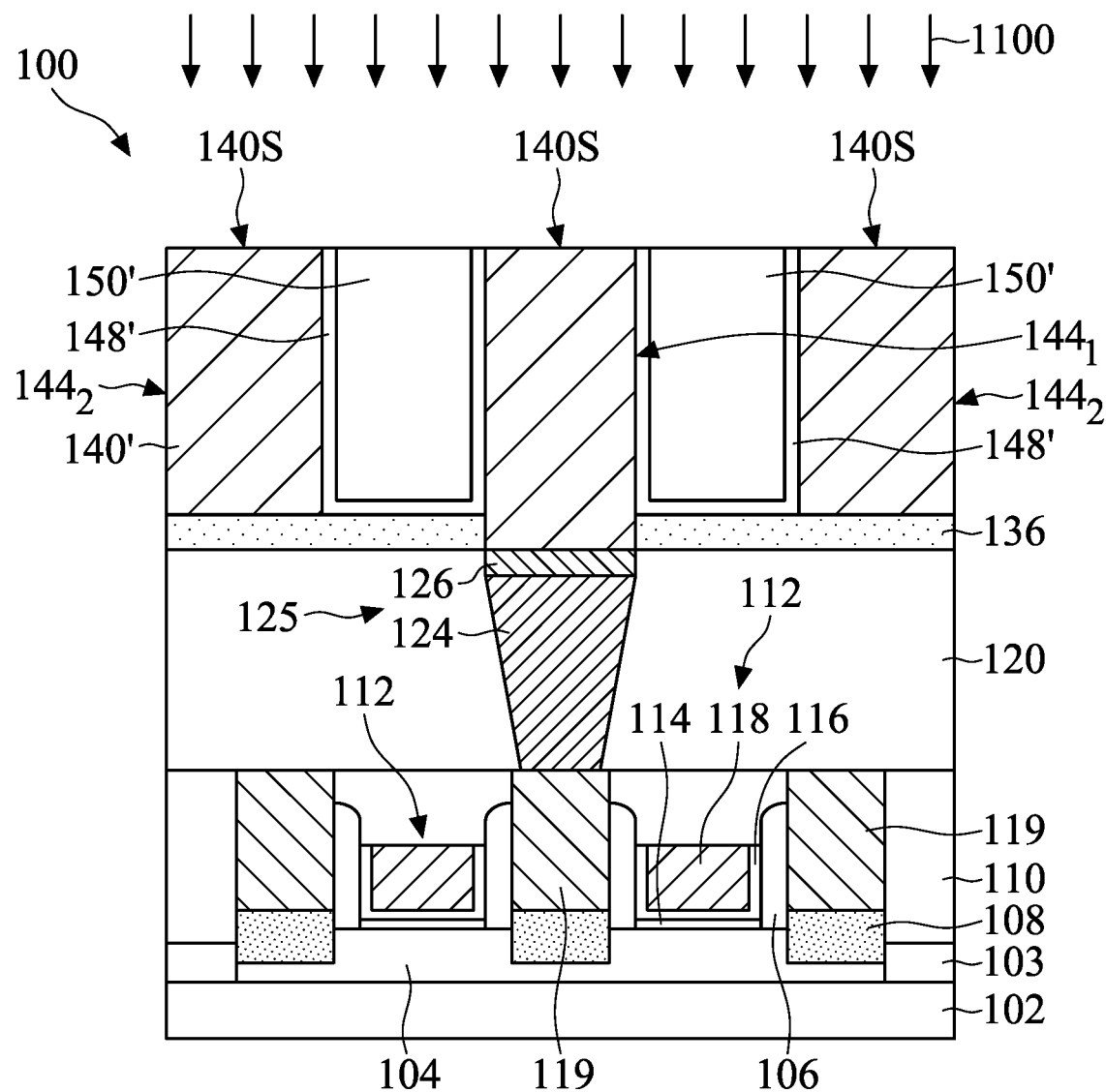
Figure 1K:
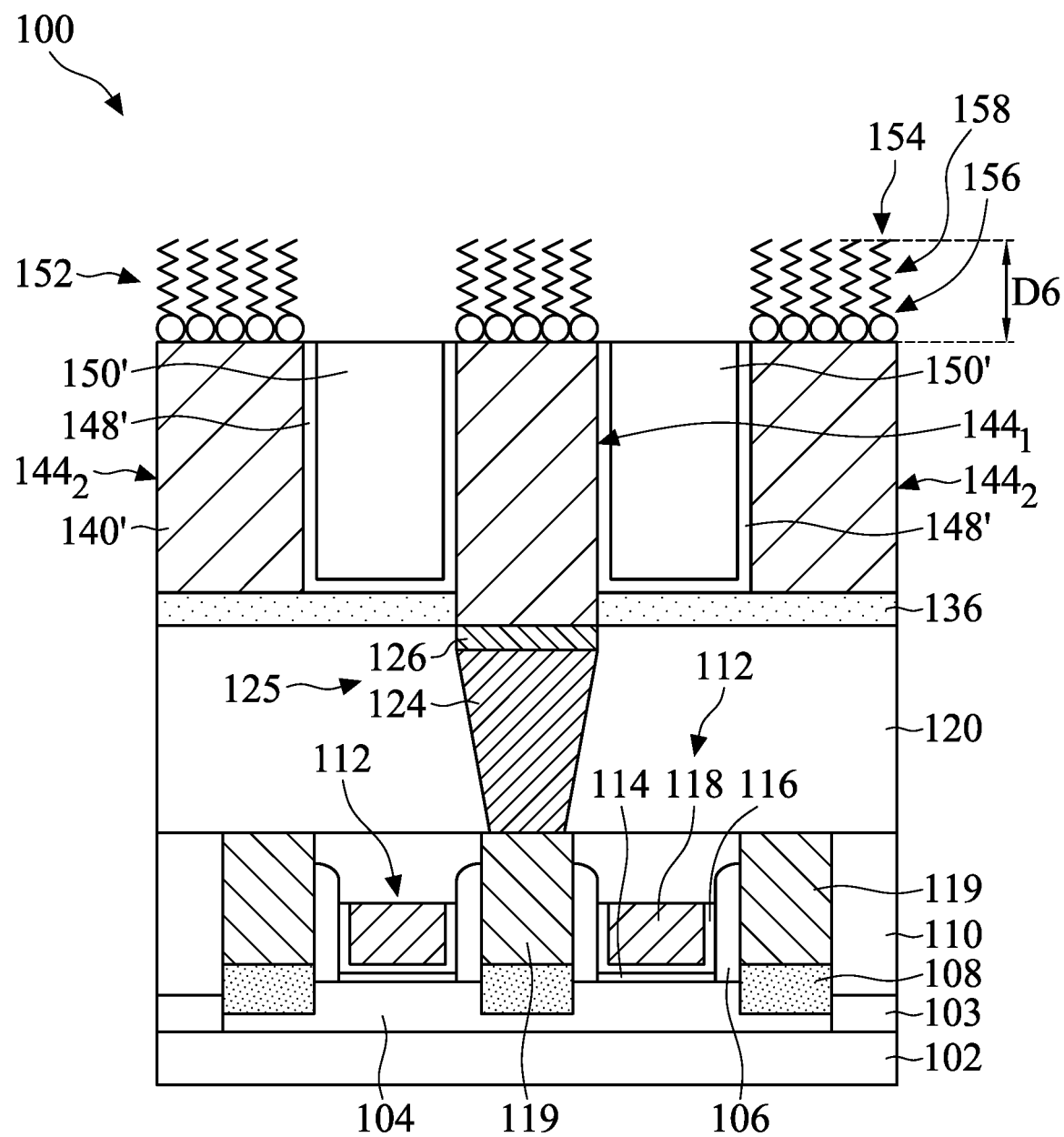
Figure 1L:
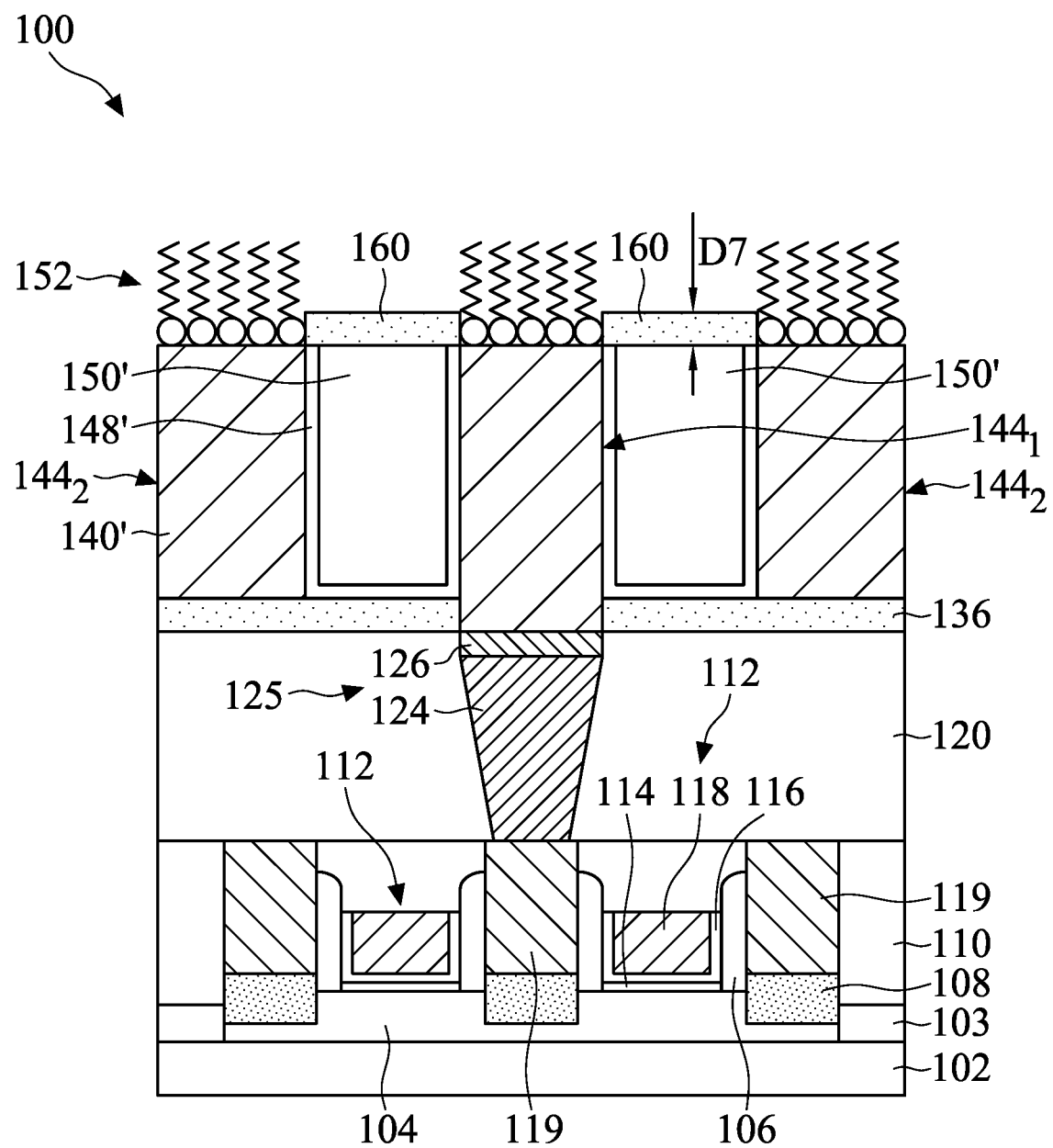
Figure 1M:
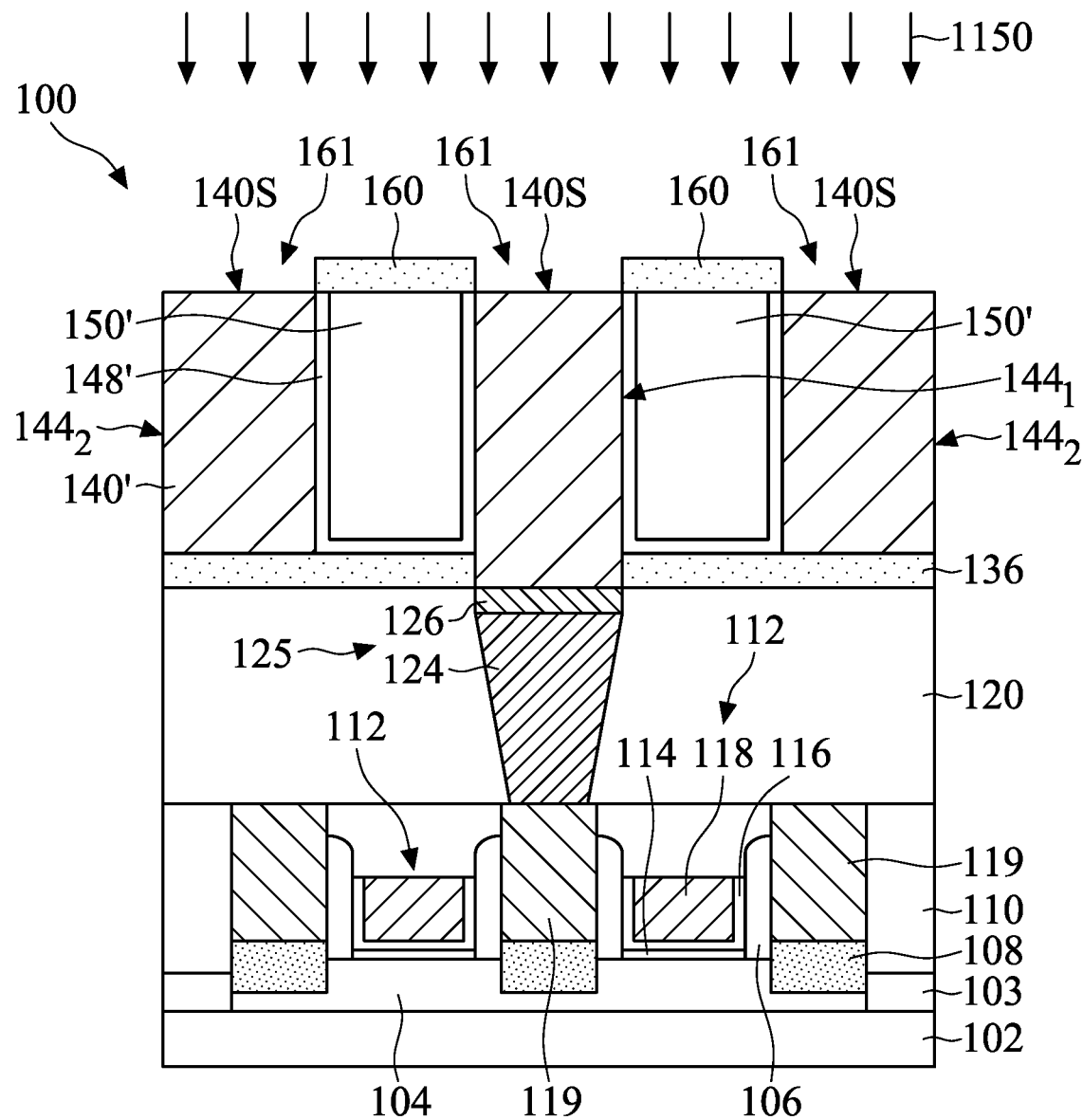
Figure 1N:
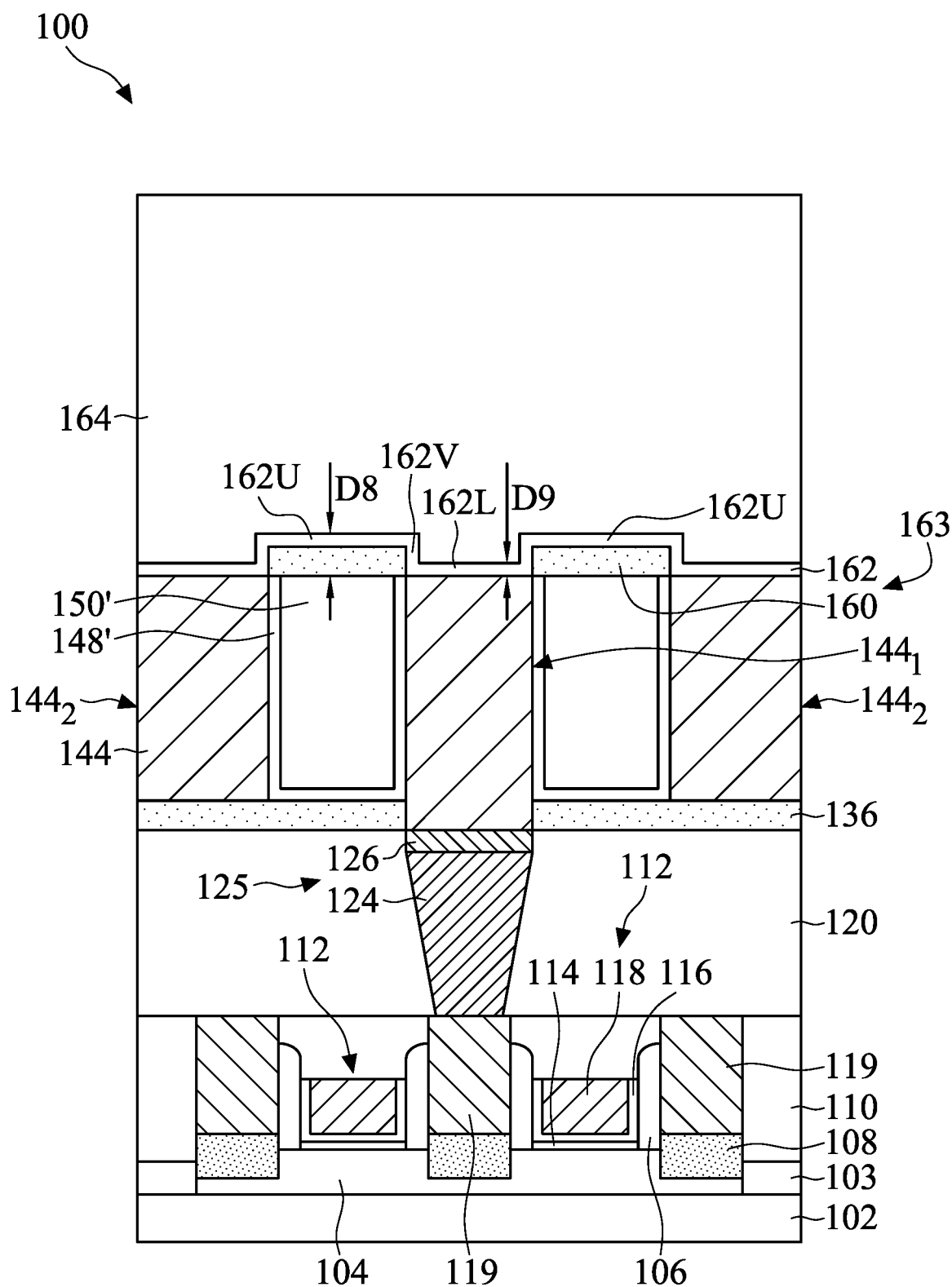
Figure 1O:
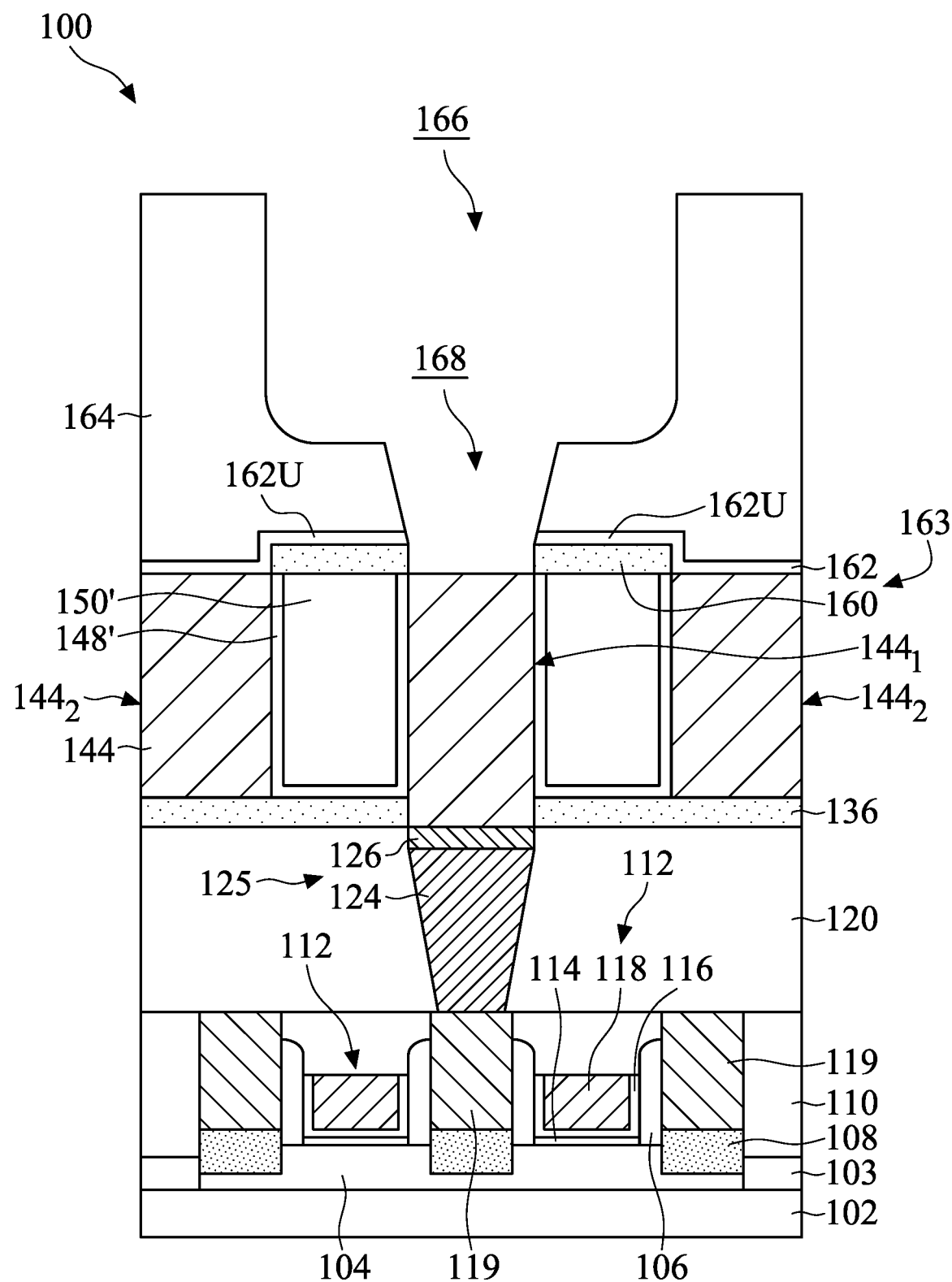
Figure 1P:
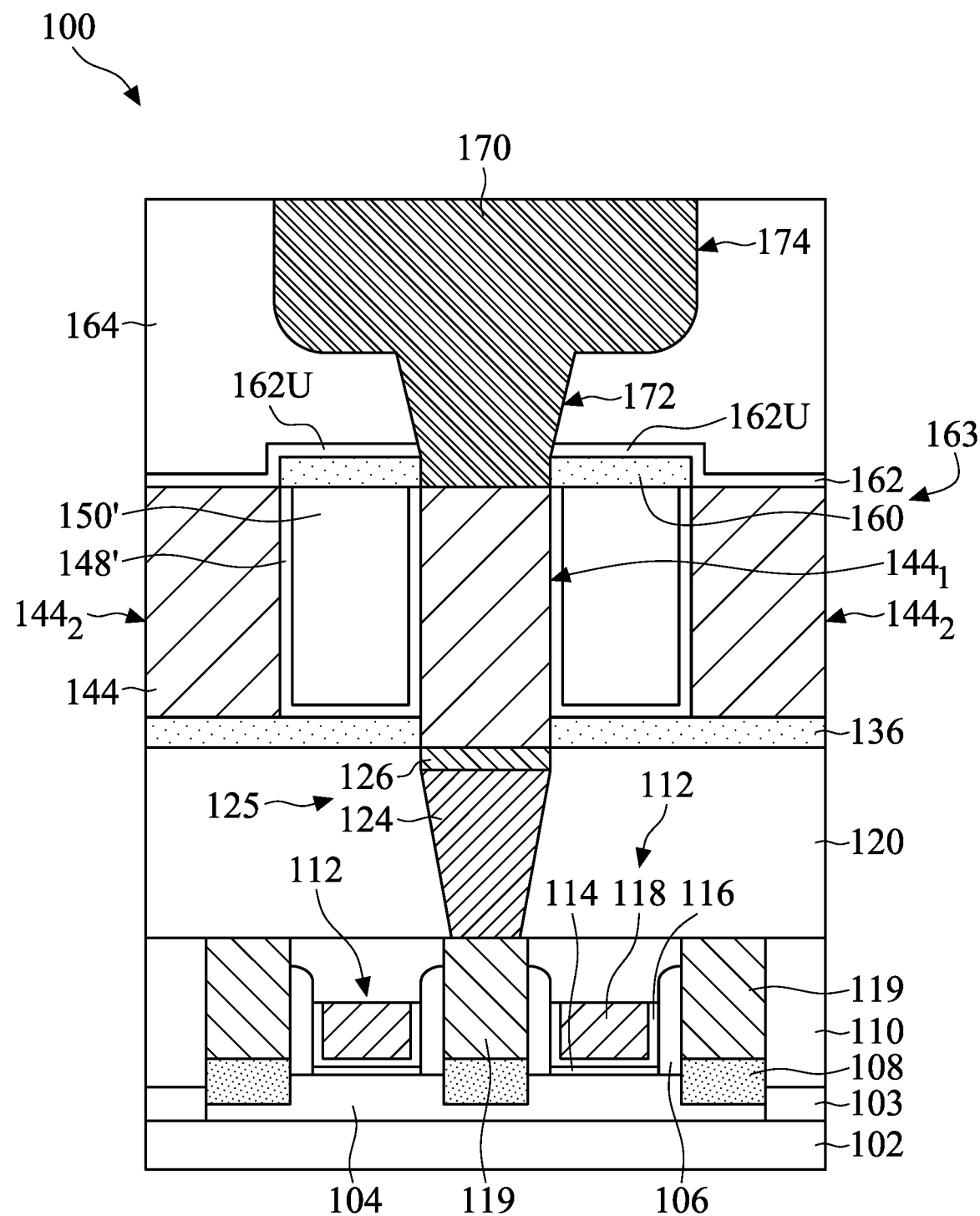

FIGS. 1A-1P are cross-sectional views illustrating the formation of a semiconductor device at various intermediate stages, in accordance with some embodiments of the disclosure. A semiconductor structure 100 is provided, as shown in FIG. 1A, in accordance with some embodiments. The semiconductor structure 100 is a portion of a FinFET device, in accordance with some embodiments. The formation of the semiconductor structure 100 includes providing a substrate 102, and forming a fin structure 104 and an isolation structure 103 on the substrate 102, in accordance with some embodiments. The isolation structure 103 surrounds a lower portion the fin structure 104, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

Though the semiconductor structure 100 is depicted with one fin structure 104, the embodiments of the present disclosure contemplate the semiconductor structure 100 having more than one fin structures 104. In some embodiments, the formation of the fin structure 104 includes recessing the substrate 102 to form trenches so that the fin structure 104 protrudes from between the trenches.

Afterward, the trenches are filled with an insulating material for the isolation structure 103, in accordance with some embodiments. The insulating material is also formed over the upper surfaces of the fin structures 104, in accordance with some embodiments. In some embodiments, the insulating material includes silicon oxide, silicon nitride, silicon oxynitride (SiON), another suitable insulating material, and/or a combination thereof. In some embodiments, the insulating material is formed using chemical vapor deposition (CVD) such as low pressure CVD (LPCVD), plasma enhanced CVD (PECVD), or high density plasma CVD (HDP-CVD), high aspect ratio process (HARP), flowable CVD (FCVD)); atomic layer deposition (ALD); another suitable method, and/or a combination thereof.

The insulating material over the upper surfaces of the fin structures 104 is removed to expose the upper surface of the fin structure 104, for example, using chemical mechanical polishing (CMP), in accordance with some embodiments. Afterward, the insulating material is further recessed to expose an upper portion of the sidewalls of the fin structures 104 and forms the isolation structure 103 that surrounds the lower portion of the fin structure 104, in accordance with some embodiments.

The formation of the semiconductor structure 100 further includes forming gate stacks 112 over a channel region of the fin structure 104, as shown in FIG. 1A, in accordance with some embodiments. In some embodiments, the gate stacks 112 extend across the fin structures 104, so that the gate stacks 112 each wrap a portion of the fin structure 104, in accordance with some embodiments. The gate stacks 112 interpose a source region and a drain region of the fin structure 104, where the channel region is defined between the source region and the drain region. The gate stacks 112 engage the channel region, so that current can flow between the source/drain regions during operation.

In some embodiments, each gate stack 112 includes an interfacial layer 114, a gate dielectric layer 116 formed on the interfacial layer 114, and a gate electrode layer 118 formed on the gate dielectric layer 116. In some embodiments, the interfacial layer 114 is made of silicon oxide ($SiO_2$). In some embodiments, the interfacial layer 114 is formed on the exposed surface of the fin structures 104 by chemical oxidation, thermal oxidation, ALD, CVD, and/or another suitable method.

In some embodiments, the gate dielectric layer 116 is made of a dielectric material with high dielectric constant (k value), for example, greater than 3.9. In some embodiments, the high-k dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or another suitable material. The high-k gate dielectric layer may be formed by ALD, physical vapor deposition (PVD), CVD, thermal oxidation, and/or another suitable method.

In some embodiments, the gate electrode layer 118 includes a conductive material, such as doped semiconductor, metal, metal alloy, or metal silicide. In some embodiments, the gate electrode layer 118 includes a single layer or alternatively a multi-layer structure, such as various combinations of a metal layer with a selected work function to enhance the device performance (work function metal layer), a liner layer, a wetting layer, an adhesion layer, a metal fill layer, and/or another suitable layer. The gate electrode layer 118 may be made of doped polysilicon, doped poly-germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof. The gate electrode layer 118 may be formed by ALD, PVD, CVD, e-beam evaporation, or another suitable process. Furthermore, the gate stack 112 may be formed separately for N-FET and P-FET transistors which may use different gate electrode materials and/or different work function materials.

The formation of the semiconductor structure 100 further includes forming gate spacer layers 106 over the substrate 102, as shown in FIG. 1A, in accordance with some embodiments. The gate spacer layers 106 extend along opposite sides of the gate stacks 112, in accordance with some embodiments. In some embodiments, the gate spacer layer 106 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layers 106 includes conformally depositing a dielectric material for the gate spacer layers 106 over the substrate 102 followed by an anisotropic etching process such as dry etching.

The formation of the semiconductor structure 100 further includes forming source/drain features 108 in the source region and the drain region of the fin structure 104, as shown in FIG. 1A, in accordance with some embodiments. The source/drain features 108 are formed on the fin structures 104 and on the opposite sides of the gate stacks 112, in accordance with some embodiments. The source/drain features 108 and the gate stack 112 between the source/drain features 108 combine to form a portion of an active device, e.g., a logic device (such as a transistor) of the resulting semiconductor device.

The formation of the source/drain features 108 includes recessing the source/drain region of the fin structures 104 to form source/drain recesses on opposite sides of the gate stacks 112, in accordance with some embodiments. The recesses may have bottom surfaces that are located at a level substantially the same as or lower than the upper surface of the isolation structure 103. Afterward, the source/drain features 108 are grown in the source/drain recesses using an epitaxial growth process, in accordance with some embodiments.

In some embodiments, the source/drain features 108 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 108 are in-situ doped during the epitaxial growth process. For example, the source/drain features 108 may be the epitaxially grown SiGe doped with boron (B). For example, the source/drain features 108 may be the epitaxially grown Si doped with carbon to form silicon:carbon (Si:C) source/drain features, phosphorous to form silicon: phosphor (Si:P) source/drain features, or both carbon and phosphorous to form silicon carbon phosphor (SiCP) source/drain features.

The formation of the semiconductor structure 100 further includes forming a lower interlayer dielectric (ILD) layer 110 over the substrate 102, as shown in FIG. 1A, in accordance with some embodiments. The lower ILD layer 110 covers the isolation structure 103, the fin structure 104, the gate stacks 112, the gate spacer layers 106, and the source/drain features 108, in accordance with some embodiments.

In some embodiments, the lower ILD layer 110 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the lower ILD layer 110 is formed using CVD (such as HDP-CVD, PECVD, or HARP), ALD, another suitable method, and/or a combination thereof. In some embodiments, the lower ILD layer 110 is a multilayer structure. For example, the lower ILD layer 110 may include an etching stop layer (ESL), e.g., silicon nitride, and one or more low-k dielectric layers, e.g., silicon oxide-based material, formed over the ESL.

In some embodiments, the semiconductor structure 100 is formed using a gate-late process. For example, before the source/drain feature 108 are formed, dummy gate structures including dummy gate dielectric layers and dummy gate electrode layers (not shown) may be formed across the fin structures 104 in the place where the gate stacks 112 are to be formed. After one of the multi-layers of the lower ILD layer 110 is formed surrounding the source/drain features 108 and the dummy gate structures, the dummy gate structures may be replaced with the gate stacks 112. The replacement process may include removing the dummy gate structures using one or more etching processes to form trenches through one of the multi-layers of the lower ILD layer 110, and forming the gate stacks 112 in the trenches. After the gate stacks 112 are formed, others of the multi-layers of the lower ILD layer 110 may be formed over the source/drain features 108 and the gate stacks 112.

The formation of the semiconductor structure 100 further includes forming a multilayer interconnect structure over the substrate 102, in accordance with some embodiments. The multilayer interconnect structure electrically couples various devices (for example, transistors, resistors, capacitors, and/or inductors) and/or components of logic devices (such as the source/drain features 108 and/or the gate stacks 112), in accordance with some embodiments.

In some embodiments, a multilayer interconnect structure typically includes a combination of dielectric layers and electrically conductive features. The conductive features are configured to form vertical interconnect features (providing, for example, vertical connection between features and/or vertical electrical routing), such as contact plugs and/or vias, and/or horizontal interconnect features (providing, for example, horizontal electrical routing), such as metal lines, in accordance with some embodiments. Vertical conductive features of a multilayer interconnect structure typically connect horizontal conductive features in different layers (or different planes) of the multilayer interconnect structure, in accordance with some embodiments. The formation of a multilayer interconnect structure is described in detail below.

Contact plugs 119 are formed through the lower ILD layer 110, as shown in FIG. 1A, in accordance with some embodiments. In some embodiments, the contact plugs 119 and the lower ILD layer 110 combine to form one interconnect layer of the multilayer interconnect structure. The contact plugs 119 land on the source/drain features 108, in accordance with some embodiments. In some embodiments, the contact plugs 119 are made of one or more conductive materials, for example, cobalt (Co), nickel (Ni), tungsten (W), titanium (Ti), tantalum (Ta), copper (Cu), aluminum (Al), ruthenium (Ru), molybdenum (Mo), TiN, TaN, and/or a combination thereof. In some embodiments, the contact plugs 119 include a silicide layer, such as WSi, NiSi, TiSi or CoSi, formed on the source/drain features 108.

In some embodiments, the formation of the contact plugs 119 includes patterning the lower ILD layer 110 to form contact openings through the lower ILD layer 110 and exposing the source/drain features 108, depositing a conductive material for the contact plugs 119 to fill the contact openings, and removing the conductive material over the upper surface of the lower ILD layer 110. In some embodiments, the conductive material is deposited using CVD, PVD, e-beam evaporation, ALD, electroplating (ECP), electroless deposition (ELD), another suitable method, or a combination thereof.

The contact plugs 119 may have a multilayer structure including, for example, metal bulk layers, liner layers, seed layers, glue layers, barrier layers, and the like. In some embodiments, the conductive material is formed using a selective deposition technique such as cyclic CVD process or ELD process, and therefore it is not necessary to form glue layer in the opening before depositing the metal bulk material. In some embodiments, if the conductive material does not easily diffuse into the dielectric material, the barrier layer may be omitted.

An upper ILD layer 120 is formed over the lower ILD layer 110 and the contact plugs 119, as shown in FIG. 1A, in accordance with some embodiments. In some embodiments, the upper ILD layer 120 is made of a dielectric material, such as USG, or doped silicon oxide such as BPSG, FSG, PSG, BSG, and/or another suitable dielectric material. In some embodiments, the upper ILD layer 120 is formed using CVD (such as HDP-CVD, PECVD, or HARP), ALD, another suitable method, and/or a combination thereof. In some embodiments, the upper ILD layer 120 is a multilayer structure. For example, the upper ILD layer 120 may include an ESL, e.g., silicon nitride, and one or more low-k dielectric layers, e.g., silicon oxide-based material, formed over the ESL.

A via 125 is formed through the upper ILD layer 120, as shown in FIG. 1A, in accordance with some embodiments. In some embodiments, the via 125 and the upper ILD layer 120 combine to form one interconnect layer of the multilayer interconnect structure that is formed over and coupled to the previous interconnect layer (including the contact plugs 119 and the lower ILD layer 110). The via 125 lands on the contact plug 119 and is coupled to the source/drain feature 108, and therefore the via 125 is also referred to as a source/drain via, in accordance with some embodiments. In some embodiments, a gate via (not shown) may be formed through the upper ILD layer 120 and the lower ILD layer 110 and lands on the gate stack 112.

The via 125 includes a metal bulk layer 124 and a metal capping layer 126 over the metal bulk layer 124, in accordance with some embodiments. In some embodiments, the metal bulk layer 124 is made of one or more conductive materials, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), and/or a combination thereof.

In some embodiments, the formation of the via 125 includes patterning the upper ILD layer 120 to form via hole through the upper ILD layer 120 and exposing the contact plug 119, depositing a conductive material for the metal bulk layer 124 to fill the via hole, and removing the conductive material over the upper surface of the upper ILD layer 120 using, for example, CMP. In some embodiments, the conductive material is deposited using CVD, PVD, ALD, another suitable method, or a combination thereof. After the removal process, the metal bulk layer 124 may have an upper surface that is substantially coplanar with or below the upper surface of the upper ILD layer 120. In some embodiments, the metal bulk layer 124 has a thickness D1 ranging from about 50 angstroms (Å) to about 500 Å.

After the metal bulk layer 124 is formed in the via hole, the metal capping layer 126 is selectively formed over the upper surface of the metal bulk layer 124, in accordance with some embodiments. The metal capping layer 126 is configured to improve the electronic migration and/or stress migration of the via 125, in accordance with some embodiments. Although FIG. 1A illustrates that the upper surface of the metal capping layer 126 is substantially coplanar with the upper surface of the upper ILD layer 120, the upper surface of the metal capping layer 126 may be slightly higher than the upper surface of the upper ILD layer 120. In some embodiments, the metal capping layer 126 has a thickness D2 ranging from about 2 Å to about 50 Å.

In some embodiments, the metal capping layer 126 is made of one or more conductive materials, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), and/or a combination thereof. In some embodiments, the metal capping layer 126 is made of a different conductive material than the metal bulk layer 124. In some embodiments, the metal capping layer 126 is made of the same conductive material as the metal bulk layer 124. In some embodiments, the metal capping layer 126 is deposited using CVD, PVD, ALD, another suitable method, or a combination thereof.

Furthermore, the via 125 may include, for example, liner layers, seed layers, glue layers, barrier layers, and the like on which the metal bulk layer 124 is formed. In some embodiments, the conductive material of the metal bulk layer 124 is formed using a selective deposition technique such as cyclic CVD process or ELD process, and therefore it is not necessary to form glue layer in the via hole before depositing the conductive material for metal bulk layer 124. In some embodiments, if the conductive material does not easily diffuse into the dielectric material (e.g., the upper ILD layer 120), the barrier layer may be omitted.

A surface treatment process 1000 is performed on the semiconductor structure 100, as shown in FIG. 1B, in accordance with some embodiments. The surface treatment process 1000 modifies the surface characteristics of the via 125 (i.e., the upper surface 126S of the metal capping layer 126). In some embodiments, the surface treatment process 1000 is a reduction process, e.g., a dry treatment using $H_2$, $NH_3$, and/or $N_2$ gases or plasmas, and/or a wet treatment using acetic acid and/or citric acid, thereby modifying the upper surface 126S of the metal capping layer 126 to have a reduced metal surface. In some embodiments, the surface treatment process 1000 is an oxidation process, e.g., a dry treatment using air, $H_2O$, $CO_2$, $NO_2$ gases or plasmas, thereby modifying the upper surface 126S of the metal capping layer 126 to have an oxidized metal surface. It should be noted that whether the modified upper surface 126S of the metal capping layer 126 is a reduced metal surface or an oxidized metal surface is dependent on a subsequently formed material, which can be easily bonded thereon.

A blocking layer 128 is selectively formed on the modified upper surface 126S (FIG. 1B) of the metal capping layer 126, as shown in FIG. 1C, in accordance with some embodiments. The blocking layer 128 a modification layer, such as self-assembled monolayer (SAM) that is only formed on the metal surface (the upper surface 126S) of the metal capping layer 126 but substantially not formed on the upper surface of the upper ILD layer 120, in accordance with some embodiments. As such, the upper surface of the upper ILD layer 120 remains exposed to the ambient atmosphere (such as air or $N_2$) after the blocking layer 128 is formed, in accordance with some embodiments. In some embodiments, the blocking layer 128 has a thickness D3 ranging from about 2 Å to about 50 Å.

The SAM of the blocking layer 128 is made of amphiphilic organic molecules 130, in which one end of the molecule 130, a head group (anchor) 132 shows a specific affinity for a metal surface, in accordance with some embodiments. The head group 132 is connected (e.g., bonded) to an alkyl chain in which a tail (terminal end) 134 can be functionalized, for example, to vary wetting and interfacial properties, in accordance with some embodiments. In some embodiments, the tail 134 is functionalized to enhance deposition selectivity of the following deposition process. For example, the tail 134 may be hydrophobic so that precursors of the following deposition process may not adhere or be anchored to the blocking layer 128 during the following deposition process.

In some embodiments, the selection of the head group depends on the application of the SAM, with the type of SAM compounds based on the utilized material of the metal capping layer 126. In some embodiments, the head group 132 includes phosphorus (P), sulfur (S), or silicon (Si). For example, the SAM (or the head group 132 of the SAM) may include an organic sulfur compound (such as thiols (e.g., dodecanethiol, alkanethiol)), an organic phosphor compound (such as ODPA (Octadecylphosphonic)), or an organic silicon compound (such as (3-Aminopropyl)triethoxysilane). The head group 132 may be in the form of phosphate, sulfate, amine, or silane-based functional groups. In some embodiments, the tail 134 is an organic chain composed largely of carbon (e.g., $C_xH_y$). In some embodiments, the tail 148 includes an alkyl chain. In some embodiments, the SAM is $C_{10}$-$C_{20}$ alkyl group, $C_{10}$-$C_{20}$ alkenyl group, or $C_{10}$-$C_{20}$ alkynyl group substituted with a hydrophilic functional group such as an alkoxy group, a hydroxyl group, an amine group, a thiol group, a carboxyl group, an ester group, an epoxy group, an aziridine group, a halogen group, an amide group, a sulfate group, a phosphate group, or the like.

For example, the SAM may include 1-Octadecanethiol, 1-Dodecanethiol, Stearic acid, 4-Dodecylbenzenesulfonic acid, dimethyl octadecylphosphonate, Bi(Dodecyl) Dithiophosphinic Acids, Bi(octadecyl) Dithiophosphinic Acids, Diethyl-n-Octadecylphosphonate, Octadecylphosphonic acid, Decylphosphonic acid, Tetradecylphosphonic acid, 2-mercaptobenzothiazole, 2-mercaptoenzoxazole, 2-mercaptobenzimidazole, Benzothiazol, Benzoxazole, Benzimidazole, 2-Methylbenzimidazole, 5,6-Dimethylbenzimidazole, 2-(Methylthio)benzimidazole, 1,2,3-triazole, 1,2,4-triazole, 3-Amino-1,2,4-triazole, 1-Hydroxybenzotriazole hydrate, 4-Methyl-1H-benzotriazole, 5-Methyl-1H-benzotriazole, 5,6-Dimethyl-1H-benzotriazole, 4-Hydroxy-1H-benzotriazole, Benzotriazole-1-carboxamide, 2-Methylbenzothiazole, Imidazole, Methimazole, 5-Phenyl-1H-tetrazole, Benzotriazole, 5-(3-Aminophenyl)tetrazole, 4-Amino-4H-1,2,4-triazole, 3-Amino-5-mercapto-1,2,4-triazole, 3-Amino-5-methylthio-1H-1,2,4-triazole, 2-aminopyrimidine, 2-mercaptopyrimidine, Adenine, Hypoxanthine, Morpholine, 5-Amino-1,3,4-thiadiazole-2-thiol, Tryptophan, Histidine, 5-(Trifluoromethyl)-1H-1,2,3-benzotriazole, 1H-Benzotriazole, 1-(4-morpholinylmethyl), Phenothiazine, Purine, Melamine, Trithiocyanuric acid, 1,3,4-Thiadiazole-2,5-diamine, 3,5-Diamino-1,2,4-triazole, 5-Aminotetrazole, 3,6-Bis(methylthio)-1,2,4,5-tetrazine, Aminophylline, etc., and the like In some embodiments, the SAM of the blocking layer 128 is formed using a wet process (such as a spin-on coating process or a dipping process). For example, the SAM of the blocking layer 128 is created by chemisorption of the hydrophilic head group 132 onto the metal surface (e.g., the upper surface 126S of the metal capping layer 126), followed by a slow two-dimensional organization of hydrophobic tail 134. SAM adsorption may occur from solution by immersion of the semiconductor structure 100 into a dilute solution of an alkane thiol in ethanol. In some embodiments, the SAM of the blocking layer 128 is formed using a vapor process (such as CVD, ALD, or a molecular layer deposition (MLD)).

The head group 132 of the organic molecule 130 has a high affinity to the metal surface (e.g., the upper surface 126S of the metal capping layer 126), and thus adhere and/or be anchored to the metal capping layer 126 rather than the dielectric surface of the upper ILD layer 120, in accordance with some embodiments. That is, the modified upper surface 126S of the metal capping layer 126 provides active sites for the head group 132 of the organic molecule 134 to adhere and/or anchor, in accordance with some embodiments. In some embodiments where the selected head group 132 of the organic molecule 134 contains sulfur (S) or silicon (Si), the upper surface 126SS of the metal capping layer 126 is modified into a reduced metal surface in the surface treatment process 1000 (FIG. 1B). In some embodiments where the selected head group 132 of the organic molecule 134 contains phosphorus (P) or nitrogen (N), the upper surface 126S of the metal capping layer 126 is modified into an oxidized metal surface in the surface treatment process 1000. Once the open active sites provided by the modified upper surface 126S have occupied by the head group 132, the reaction of the deposition process will stop, as there are no more open active sites to which the head group 132 will adhere and/or be anchored, in accordance with some embodiments.

An etching stop layer (ESL) 136 is selectively formed on the upper surface of the upper ILD layer 120, as shown in FIG. 1D, in accordance with some embodiments. Generally, an ESL may provide a mechanism to stop or slow down an etching process when forming, e.g., openings, holes, trenches, etc. The ESL 136 may be formed of a dielectric material having a different etching selectivity from adjacent layers or components.

The ESL 136 is substantially not formed over the blocking layer 128, in accordance with some embodiments. That is, the ESL 136 is aligned over the upper ILD layer 120, but substantially not formed directly above the via 125, in accordance with some embodiments. Therefore, the ESL 136 may also refer to as a self-aligned ESL 136. As such, the upper surface of the blocking layer 128 remains exposed to the ambient atmosphere (such as air or $N_2$) after the ESL 136 is formed, in accordance with some embodiments. In some embodiments, the ESL 136 has a thickness D4 ranging from about 2 Å to about 50 Å.

In some embodiments, the ESL 136 is made of a dielectric material with a high-k dielectric constant (such as greater than about 3.9) greater than neighboring low-k dielectric materials (such as a subsequently formed IMD layer). In some embodiments, the ESL 136 is made of aluminum oxide, zirconium oxide, hafnium oxide, yttrium oxide, hafnium oxide, another suitable metal oxide, and/or a combination thereof. The ESL 136 is deposited using CVD, ALD, spin-on coating, another suitable method, or a combination thereof. Because the SAM of the blocking layer 128 includes organic tails 134 that is hydrophobic, the blocking layer 128 may prevent at least one of the precursors (e.g., $H_2O$) for forming the ESL 136 from adhering or being anchored to the blocking layer 128 during depositing the ESL 136.

A cleaning process 1050 is performed on the semiconductor structure 100, as shown in FIG. 1E, in accordance with some embodiments. The cleaning process 1050 removes the blocking layer 128 to form an opening 137 that passes through the ESL 136 and exposes the upper surface 126S of the metal capping layer 126 of the via 125, in accordance with some embodiments. Alternatively, the cleaning process 1050 may remove only a portion of the blocking layer 128. For example, the cleaning process 1050 may remove the organic tails 134 (FIG. 1C) of the organic molecules 130 of the blocking layer 128, thereby leaving the head group 132 on the upper surface 126S of the metal capping layer 126. In some embodiments, the cleaning process 1050 includes a thermal process, a plasma process, and or a wet etching process.

A metal bulk layer 140 is formed over the upper surface of the ESL 136, as shown in FIG. 1F, in accordance with some embodiments. The metal bulk layer 140 is filled into the opening 137 to contact the via 125, in accordance with some embodiments. In some embodiments, the ESL 136 also functions as a glue layer that adheres the metal bulk layer 140 to the upper ILD layer 120.

In some embodiments, the metal bulk layer 140 is made of a conductive material, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), an alloy thereof, and/or a combination thereof. In some embodiments, the metal bulk layer 140 is globally deposited using CVD, PVD, ALD, another suitable method, or a combination thereof.

A hard mask layer 142 is formed over the upper surface of the metal bulk layer 140, as shown in FIG. 1F, in accordance with some embodiments. In some embodiments, the hard mask layer 142 is made of a dielectric material such as SiN, SiOC, AlON, $Al_2O_3$, SiCN, SiCN, TiN, WN, WC, and/or a combination thereof. In some embodiments, the hard mask layer 142 is formed using CVD (such as PECVD or LPCVD), ALD, another suitable method, and/or a combination thereof.

The metal bulk layer 140 is patterned to form metal lines 144 (including metal lines $144_1$ and $144_2$) and trenches 146, as shown in FIG. 1G, in accordance with some embodiments. The metal line $144_1$ is separated from the metal lines $144_2$ by the trenches 146, in accordance with some embodiments.

In some embodiments, the patterning process includes forming a patterned photoresist layer on the upper surface of the hard mask layer 142, and etching the hard mask layer 142 uncovered by the patterned photoresist layer. For example, a photoresist may be formed on the hard mask layer 142, such as by using spin-on coating, and patterned with a pattern corresponding to the trenches 146 by exposing the photoresist to light using an appropriate photomask. Exposed or unexposed portions of the photoresist may be removed depending on whether a positive or negative resist is used. The pattern of the photoresist may then be transferred to the hard mask layer 142, such as by using one or more suitable etch processes, thereby forming a patterned hard mask layer 142' as an etching mask. The photoresist can be removed in an ashing or a wet strip process, for example.

The patterned hard mask layer 142' may transfer the pattern to the metal bulk layer 140 to form patterned metal bulk layer 140' which may be by using one or more suitable etching processes. The etch processes may include a reactive ion etch (RIE). The etching processes may be anisotropic. In some embodiments, the etch processes create the trenches 146 through the metal bulk layer 140 and is performed until the upper surface of the ESL 136 is exposed from the trenches 146.

Each of the metal lines $144_1$ and $144_2$ includes the patterned metal bulk layer 140', in accordance with some embodiments. The metal line $144_1$ is located directly above and electrically connected to the via 125, thereby being coupled to the source/drain feature 108, in accordance with some embodiments. The metal lines $144_2$ may be coupled to other components of the logic devices (such as the gate stacks 112) through other vias (such as a gate via). In some embodiments, the metal lines 144 have a thickness D5 ranging from about 50 Å to about 500 Å.

The ESL 136 may also function as a glue layer to adhere the metal bulk layer 140 to the upper ILD layer 120, and therefore it is not necessary to form additional conductive glue layer, e.g., including Ti, Ta, TiN and/or TaN, with a higher resistance than the metal bulk layer 140, between the metal bulk layer 140 and the upper ILD layer 120 (or the ESL 136) and/or between the metal bulk layer 140 and the via 125. That is, the metal bulk layer 140' of the metal line $144_1$ is formed to directly contact (or interface) the metal capping layer 126 of the via 125, in accordance with some embodiments. Therefore, the resistance of the multilayer interconnect structure may be reduced, thereby enhancing the performance of the resulting semiconductor device.

An encapsulating layer 148 is conformally formed over the semiconductor structure 100, as shown in FIG. 1H, in accordance with some embodiments. The encapsulating layer 148 is conformally formed along and covers the sidewalls of the metal lines 144 and the upper surfaces and the sidewalls of the patterned hard mask layer 142', in accordance with some embodiments. The encapsulating layer 148 is also conformally formed along the upper surface of the ESL 136, in accordance with some embodiments.

The encapsulating layer 148 is configured to prevent moisture from a dielectric material subsequently formed in the trenches 146 from reacting with the metal lines 144, provide better adhesion of the metal lines 144 to the subsequently formed dielectric material, and/or prevent the metal atoms from the metal lines 144 from diffusing into the subsequently formed dielectric material, in accordance with some embodiments.

In some embodiments, the encapsulating layer 148 is made of a dielectric material such as silicon oxide (SiO), oxygen-doped silicon carbide (SiC:O), oxygen-doped silicon nitride (SiN:O), silicon carbon nitride (SiCN), oxygen-doped silicon carbon nitride (SiCN:O), another suitable dielectric material, or a combination thereof. In some embodiments, the encapsulating layer 148 is formed using CVD, PVD, ALD, another suitable method, or a combination thereof. In some embodiments, the encapsulating layer 148 is formed using a plasma deposition process such as PECVD to have a higher density to isolate the metal lines 144 from moisture.

An IMD layer 150 is formed over the encapsulating layer 148, as shown in FIG. 1H, in accordance with some embodiments. The IMD layer 150 is filled into trenches 146, in accordance with some embodiments.

In some embodiments, the IMD layer 150 is made of one or more dielectric materials, such as silicon oxide (SiO), silicon nitride (SiN), silicon oxynitride (SiON), dielectric material(s) with low dielectric constant (low-k) such as SiCOH, SiOCN, and/or SiOC, and/or a combination thereof. A low-k dielectric material is a dielectric material with a dielectric constant lower than about 3.9. In some embodiments, the IMD layer 150 is made of SiCOH which provides better adhesion to the encapsulating layer 148.

In some embodiments, the IMD layer 150 is made of an extreme low-k (ELK) dielectric material with a dielectric constant (k) less than about 3.0, or even less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the IMD layer 150 is a porous SiCOH that has a lower density and a lower dielectric constant than the encapsulating layer 148. In some embodiments, the IMD layer 150 is formed using CVD (such as LPCVD, HARP, and FCVD), ALD, spin-on coating, another suitable method, or a combination thereof. A post-curing process (e.g., UV curing) may be performed on the as-deposited ELK dielectric material for the IMD layer 150 to form a porous structure.

The IMD layer 150 and the encapsulating layer 148, formed over the upper surface of the metal lines 144, are removed using, for example, CMP, as shown in FIG. 1I, in accordance with some embodiments. The removal process exposes the upper surface of the metal bulk layer 140', in accordance with some embodiments. The removal process also removes the patterned mask layer 142' (FIG. 1H), in accordance with some embodiments.

The IMD layer 150 and the encapsulating layer 148 that remain in the trenches 146 are referred to as an IMD layer 150' and an encapsulating layer 148', in accordance with some embodiments. The IMD layer 150' surrounds the metal lines 144 and separates the metal lines $144_1$ from the metal lines $144_2$, in accordance with some embodiments. In some embodiments, the metal lines 144, the self-aligned ESL 136, the encapsulating layer 148', and the IMD layer 150' combine to form one interconnect layer of the multilayer interconnect structure that is formed over and coupled to the previous interconnect layer (including the via 125 and the upper ILD layer 120).

A surface treatment process 1100 is performed on the semiconductor structure 100, as shown in FIG. 1J, in accordance with some embodiments. The surface treatment process 1000 modifies the surface characteristics of the metal lines 144 (i.e., the upper surface 140S of the metal bulk layer 140'). In some embodiments, the surface treatment process 1100 is a reduction process, e.g., a dry treatment using $H_2$ and/or $N_2$ gases or plasmas, and/or a wet treatment using acetic acid and/or citric acid, thereby modifying the upper surface 140S of the metal bulk layer 140' to have a reduced metal surface. In some embodiments, the surface treatment process 1100 is an oxidation process, e.g., a dry treatment using air, $H_2O$, $CO_2$, $NO_2$ gases or plasmas, thereby modifying the upper surface 140S of the metal bulk layer 140' to have an oxidized metal surface. It should be noted that whether the modified upper surface 140S of the metal bulk layer 140' is a reduced metal surface or an oxidized metal surface is dependent on a subsequently formed material, which can be easily bonded thereon.

A blocking layer 152 is selectively formed on the modified upper surface 140S of the metal bulk layer 140', as shown in FIG. 1K, in accordance with some embodiments. The blocking layer 152 is a modification layer, such as a SAM that is only formed on the metal surface (the upper surface 140S) of the metal bulk layer 140' but substantially not formed on the upper surface of the IMD layer 150' or the encapsulating layer 148', in accordance with some embodiments. As such, the upper surfaces of the IMD layer 150' or the encapsulating layer 148' remains exposed to the ambient atmosphere (such as air or $N_2$) after the blocking layer 152 is formed, in accordance with some embodiments. In some embodiments, the blocking layer 152 has a thickness D6 ranging from about 2 Å to about 50 Å.

The SAM of the blocking layer 152 is composed of amphiphilic organic molecules 154 including a head group (anchor) 156 and a tail (terminal end) 158. The head group 156 shows a specific affinity for a metal surface, in accordance with some embodiments. The tail 158 is functionalized to enhance deposition selectivity of the following deposition process. The composition and the formation method of the blocking layer 152 are similar to the blocking layer 128 described above with respect to FIG. 1C, in accordance with some embodiments.

An ESL 160 is selectively formed on the upper surfaces of the IMD layer 150' and the encapsulating layer 148', as shown in FIG. 1L, in accordance with some embodiments. The organic tails 156 of the blocking layer 152 prevents the ESL 160 from being formed thereon, in accordance with some embodiments. The ESL 160 is aligned over the IMD layer 150' and the encapsulating layer 148', but substantially not formed directly above the metal lines 144, in accordance with some embodiments. Therefore, the ESL 160 may also refer to as a self-aligned ESL 160. As such, the upper surface of the blocking layer 152 remains exposed to the ambient atmosphere (such as air or $N_2$) after the ESL 160 is formed, in accordance with some embodiments. In some embodiments, the ESL 160 has a thickness D7 ranging from about 2 Å to about 50 Å.

In some embodiments, the ESL 160 is made of a dielectric material with a high-k dielectric constant (such as greater than about 3.9) greater than neighboring low-k dielectric materials (such as the encapsulating layer 148', the IMD layer 150', and a subsequently formed IMD layer). In some embodiments, the ESL 160 is made of oxides of aluminum oxide, zirconium oxide, hafnium oxide, yttrium oxide, hafnium oxide, another suitable metal oxide, and/or a combination thereof. The ESL 160 is deposited using CVD, ALD, spin-on coating, another suitable method, or a combination thereof.

A cleaning process 1150 is performed on the semiconductor structure 100, as shown in FIG. 1M, in accordance with some embodiments. The cleaning process 1150 removes the blocking layer 152 to form an opening 161 that passes through ESL 160 and exposes the upper surface 140S of the metal bulk layer 140' of the metal lines 144, in accordance with some embodiments. Alternatively, the cleaning process 1150 may remove only a portion of the blocking layer 152. For example, the cleaning process 1150 may remove the organic tails 158 (FIG. 1L) of the organic molecules 154 of the blocking layer 152, thereby leaving the head group 156 on the upper surface 140S of the metal bulk layer 140'. In some embodiments, the cleaning process 1150 includes a thermal process, a plasma process, and or a wet etching process.

A conformal ESL 162 is formed over the metal lines 144 and the self-aligned ESL 160, as shown in FIG. 1N, in accordance with some embodiments. The conformal ESL 162 is conformally formed along and covers the upper surfaces 140S of the metal bulk layer 140' and the sidewalls and the upper surface of the self-aligned ESL 160, in accordance with some embodiments.

The conformal ESL 162 includes a vertical portion 162V along the sidewalls of the self-aligned ESL 160, a horizontal lower portion 162L along the upper surfaces 140S of the metal bulk layer 140', and a horizontal upper portion 162U along the upper surfaces of the self-aligned ESL 160, in accordance with some embodiments. The horizontal upper portion 162U is located at a higher level than the horizontal lower portion 162L and connects the horizontal lower portion 162L through the vertical portion 162V, in accordance with some embodiments.

In some embodiments, the material of the conformal ESL 162 is the same as the self-aligned ESL 160. In some embodiments, the material of the conformal ESL 162 is different than the self-aligned ESL 160. In some embodiments, the conformal ESL 162 is made of a dielectric material with a high-k dielectric constant (such as greater than about 3.9) greater than neighboring low-k dielectric materials (such as a subsequently formed IMD layer). In some embodiments, the conformal ESL 162 is made of oxides of aluminum oxide, zirconium oxide, hafnium oxide, yttrium oxide, hafnium oxide, another suitable metal oxide, and/or a combination thereof. The conformal ESL 162 is globally deposited using CVD, ALD, spin-on coating, another suitable method, or a combination thereof.

The conformal ESL 162 and the self-aligned ESL 160 are collectively referred as an ESL 163, in accordance with some embodiments. A thickness D8 of the ESL 163 along the upper surface of the IMD layer 150' is thicker than a thickness D9 the ESL 163 along the upper surface of the metal lines 144, in accordance with some embodiments. As such, the ESL 163 may sufficiently prevent the IMD layer 150' from damage due to a subsequent etching process.

An IMD layer 164 is formed over the ESL 163, as shown in FIG. 1N, in accordance with some embodiments. The IMD layer 164 is filled into the openings 161 (FIG. 1M), in accordance with some embodiments. In some embodiments, the IMD layer 164 is made of one or more dielectric materials, such as silicon oxide (SiO), silicon nitride (SiN), silicon oxynitride (SiON), dielectric material(s) with low dielectric constant (low-k) such as SiCOH, SiOCN, and/or SiOC, and/or a combination thereof. In addition, the IMD layer 164 may be a multilayer structure. For example, the IMD layer 164 may include one or more etching stop layers and one or more low-k dielectric layers.

In some embodiments, the IMD layer 164 is made of ELK dielectric material which includes carbon doped silicon oxide, amorphous fluorinated carbon, parylene, BCB, PTFE (Teflon), or silicon oxycarbide polymers (SiOC). In some embodiments, ELK dielectric materials include a porous version of an existing dielectric material, such as HSQ, porous MSQ, porous PAE, porous SiLK, or porous silicon oxide ($SiO_2$). In some embodiments, the IMD layer 164 is formed using CVD (such as LPCVD, HARP, and FCVD), ALD, spin-on coating, another suitable method, or a combination thereof. A post-curing process (e.g. UV curing) may be performed on the as-deposited ELK dielectric material for the IMD layer 164 to form a porous structure.

A trench 166 and a via hole 168 are formed through the IMD layer 164, as shown in FIG. 1O, in accordance with some embodiments. A trench 166 is formed in an upper portion of the IMD layer 164, in accordance with some embodiments. The via hole 168 is formed below and connects the trench 166, in accordance with some embodiments. The via hole 168 is aligned above the metal line $144_1$, in accordance with some embodiments. The via hole 168 penetrates through the horizontal lower portion 162L and two adjacent vertical portions 162V of the conformal ESL 162 to expose the upper surface 140S of the metal line $144_1$.

The trench 166 and the via hole 168 are formed using separate patterning processes, in accordance with some embodiments. For example, the trench 166 may be formed before the via hole 168. The patterning process for forming the trench 166 may include forming a patterned mask layer (such as photoresist layer and/or hard mask layer, not shown) on the IMD layer 164. The patterned mask layer may have patterns (e.g., openings) corresponding to the trench 166. The portion of IMD layer 164 exposed from the openings of the patterned mask layer may be etched away, thereby forming the trench 166. The etch process may be performed until an ESL of the multilayers of the IMD layer 124. The etch process may include a reactive ion etch (RIE), neutral beam etch (NBE), inductive coupled plasma (ICP) etch, the like, or a combination thereof. The etch processes may be anisotropic. Afterward, the patterned mask layer may be removed.

The via hole 168 may be formed using similar patterning steps as the trench 166. In some embodiments, an etching selectivity of the ESL 163 to the IMD layer 164 (e.g., the ratio of an etching rate of the IMD layer 164 to an etching rate of the ESL 163) ranges from about 6 to about 10 in the etching process for forming the via hole 168.

As the scale of the semiconductor devices continues to shrink, one of the design challenges of the semiconductor devices is to improve via-to-line overlay window. The portion of the ESL 163 along the upper surface of the IMD layer 150' is thicker than the portion of the ESL 163 along the upper surface of the metal lines 144, in accordance with some embodiments. As such, while the via hole 168 extends to and exposes the metal line $144_1$, the thicker portion of the ESL 163 may protect the IMD layer 150' adjacent to the metal line $144_1$ from damage due to the etching process. Therefore, the via-to-line overlay window and the TDDB window of the resulting semiconductor device may be improved, which may enhance the reliability of the resulting semiconductor device.

A metal line 174 and a via 172 are formed in the trench 166 and the via hole 168 respectively, as shown in FIG. 1P, in accordance with some embodiments. The metal line 174 is formed in an upper portion of the IMD layer 164, in accordance with some embodiments. The via 172 is formed below and connects the metal line 174, in accordance with some embodiments. The via 172 is aligned above and contacts to the metal line $144_1$, so that the metal line 174 is coupled to the source/drain feature 108 through the via 172, the metal line $144_1$, and the contact plug 125, in accordance with some embodiments. In some embodiments, the metal line 174, the via 172, the IMD layer 164, and the ESL 163 combine to form one interconnect layer of the multilayer interconnect structure that is formed over and coupled to the previous interconnect layer (including the metal lines 144, the encapsulating layer 148', the ESL 136, and the IMD layer 150').

In some embodiments, the metal line 174 and the via 172 are formed a metal bulk layer 170. Each of the metal line 174 and the via 172 includes the metal bulk layer 170, in accordance with some embodiments. In some embodiments, the metal bulk layer 170 is filled into the trench 166 and the via hole 168. In some embodiments, the metal bulk layer 170 is made of one or more conductive materials, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), and/or a combination thereof. In some embodiments, the metal bulk layer 170 is globally deposited using CVD, PVD, ALD, another suitable method, or a combination thereof. The metal line 174 and the via 172 119 may have a multilayer structure including, for example, liner layers, seed layers, glue layers, barrier layers, and the like on which the metal bulk layer 170 is formed.

Afterward, the metal bulk layer 170, formed above the upper surface of the IMD layer 164, are removed using, for example, CMP until the upper surface of the IMD layer 164 is exposed, in accordance with some embodiments. After the metal line 174 and the via 172 are formed, additional interconnect layers (including such as ESLs, IMD layers and electrically conductive features (e.g., metal lines and vias)) of the multilayer interconnect structure may be formed over the IMD layer 164 to produce a semiconductor device.

Figure 2:
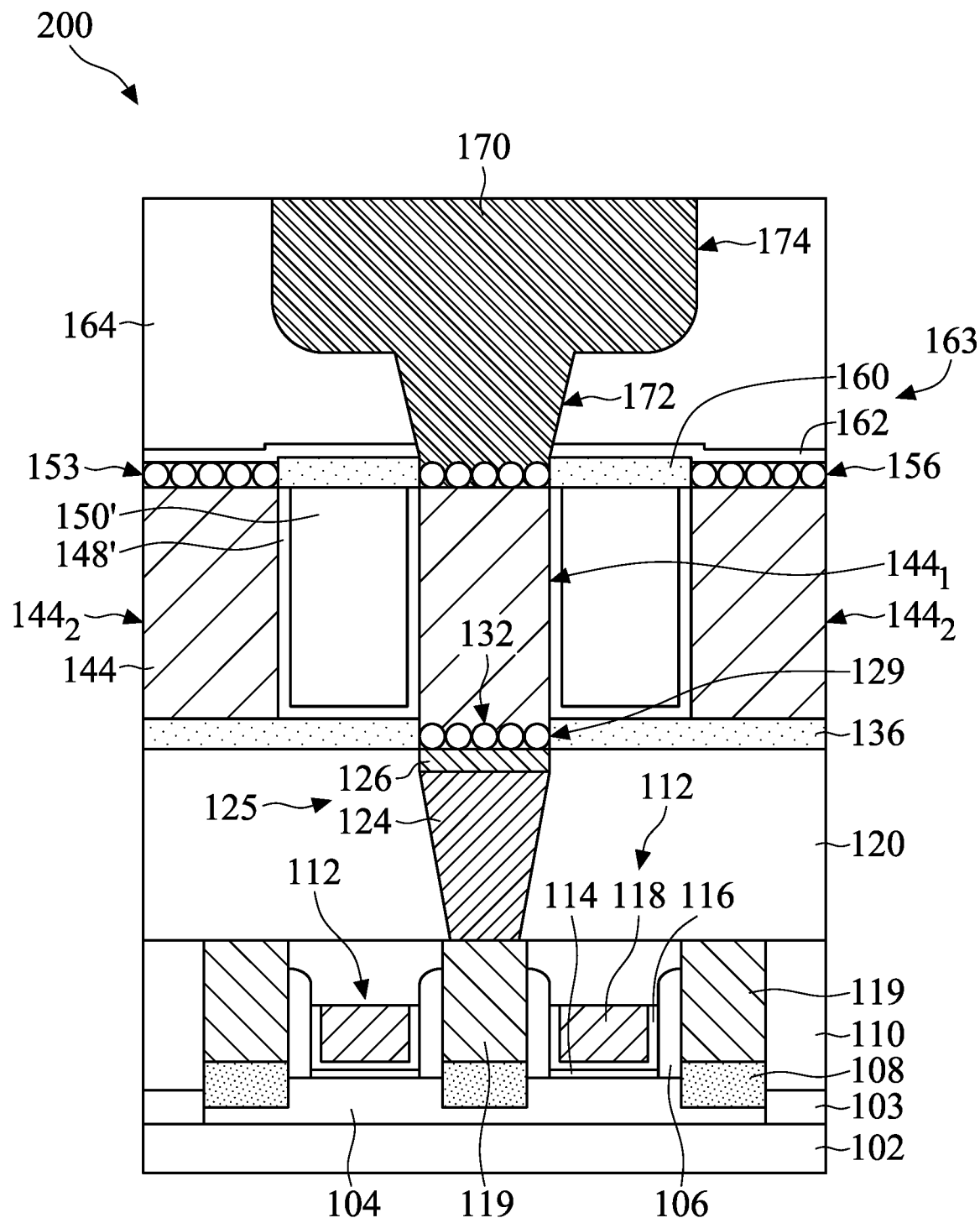
FIG. 2 is a modification of FIG. 1P in accordance with some embodiments.

FIG. 2 is a cross-sectional view of a semiconductor structure 200 that is a modification of the semiconductor structure 100 of FIG. 1N in accordance with some embodiments. The semiconductor structure 200 is similar to the semiconductor structure 100 of FIG. 1P except for the head group remaining on the metal surface, in accordance with some embodiments.

The cleaning process 1050 previously described with respect to FIG. 1E may remove at least a portion of the blocking layer 128. In some embodiments, the cleaning process 1050 removes the organic tails 134 of the organic molecules 130 of the blocking layer 128, thereby remaining the head groups 132 of the organic molecules 130 of the blocking layer 128 on the upper surface 126S of the metal capping layer 126, in accordance with some embodiments. The remaining portion of the blocking layer 128 is referred to as a blocking layer 129. Afterward, the metal line $144_1$ is formed to cover the blocking layer 129, in accordance with some embodiments.

Similarly, the cleaning process 1150 previously described with respect to FIG. 1M removes the organic tails 158 of the organic molecules 154 of the blocking layer 152, thereby remaining the head groups 156 of the organic molecules 154 of the blocking layer 152 on the metal bulk layer 140', in accordance with some embodiments. The remaining portion of the blocking layer 152 is referred to as a blocking layer 153. Afterward, the via 172 is formed to cover the blocking layer 153, in accordance with some embodiments. Alternatively, the blocking layer 153, formed over the upper surface of the metal line $144_1$, may be removed in the etching process for forming the via hole 168.

Figure 3A:
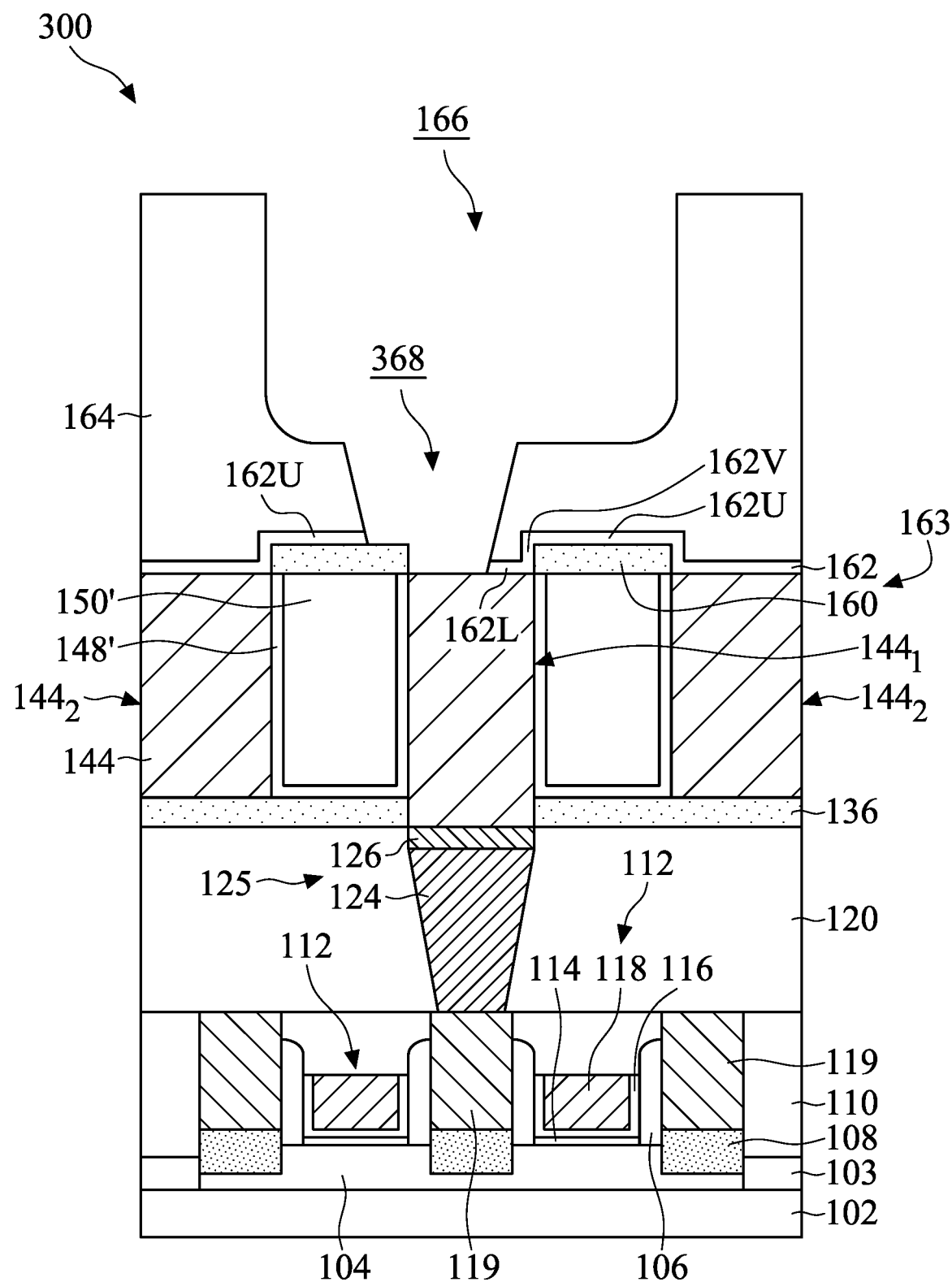
FIGS. 3A and 3B are cross-sectional views illustrating the formation of a semiconductor device at various intermediate stages, in accordance with some embodiments of the disclosure.
Figure 3B:
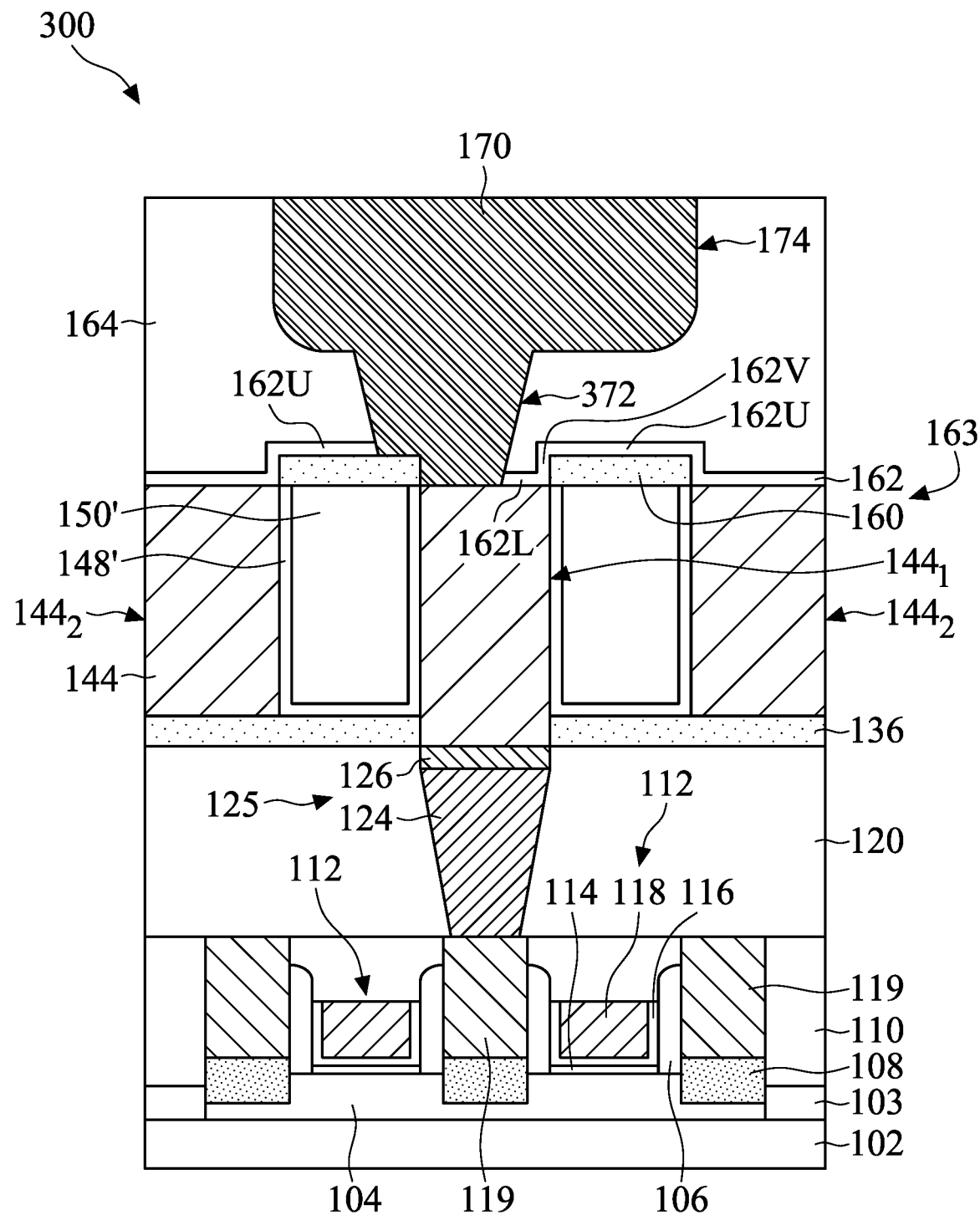

FIGS. 3A and 3B are cross-sectional views illustrating the formation of a semiconductor device at various intermediate stages, in accordance with some embodiments of the disclosure. FIGS. 3A and 3B illustrate a semiconductor structure 300 that is similar to the semiconductor structure 100 of FIGS. 1O and 1P except for a via hole 368, in accordance with some embodiments of the disclosure.

Continuing from FIG. 1N, a trench 166 and a via hole 368 are formed through the IMD layer 164, as shown in FIG. 3A, in accordance with some embodiments. The via hole 368 is offset from the metal line $144_1$, in accordance with some embodiments. The via hole 368 exposes the upper surface of the metal line $144_1$, in accordance with some embodiments. The via hole 368 also exposes the upper surface of the self-aligned ESL 160, so that the self-aligned ESL 160 extends beyond an end of the horizontal upper portion 162U the conformal ESL 162 to form a step, in accordance with some embodiments.

A metal line 174 and a via 372 are formed in the trench 166 and the via hole 368 respectively, as shown in FIG. 3B, in accordance with some embodiments. The via 368 is formed below and connects the metal line 174, in accordance with some embodiments. The via 372 is offset from and contacts the metal line $144_1$, in accordance with some embodiments. The via 372 lands on the portion of the self-aligned ESL 160 extending beyond the conformal ESL 162, so that the via 372 has a step-shape, in accordance with some embodiments.

The portion of the ESL 163 along the upper surface of the IMD layer 150' is thicker than the portion of the ESL 163 along the upper surface of the metal lines 144, in accordance with some embodiments. As such, while the via hole 368 extends to and exposes the metal line $144_1$, the thicker portion of the ESL 163 may protect the IMD layer 150' adjacent to the metal line $144_1$ from damage due to the etching process. Therefore, the via-to-line overlay window and the TDDB window of the resulting semiconductor device may be improved, which may enhance the reliability of the resulting semiconductor device.

Figure 4A:
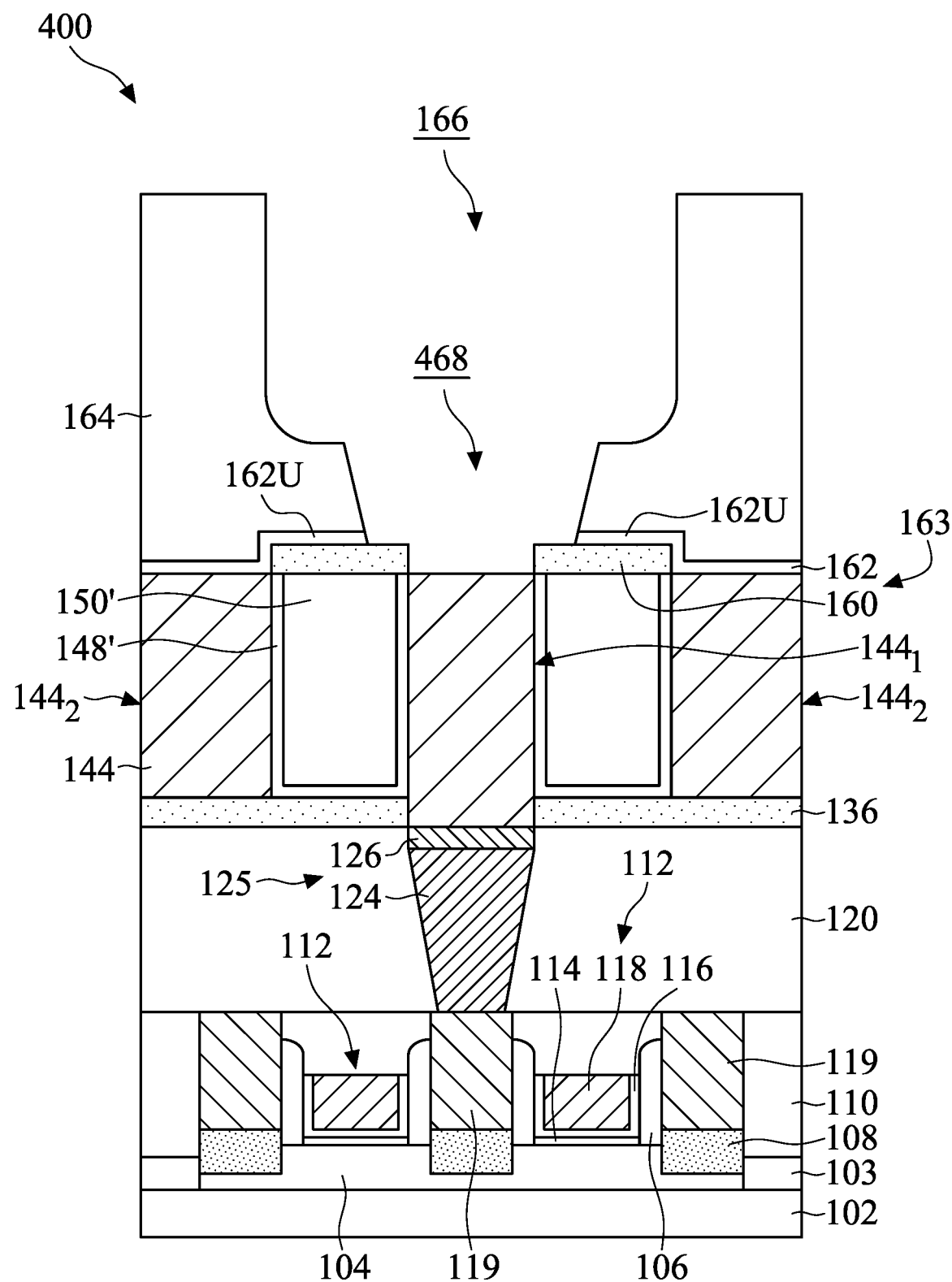
FIGS. 4A and 4B are cross-sectional views illustrating the formation of a semiconductor device at various intermediate stages, in accordance with some embodiments of the disclosure.
Figure 4B:
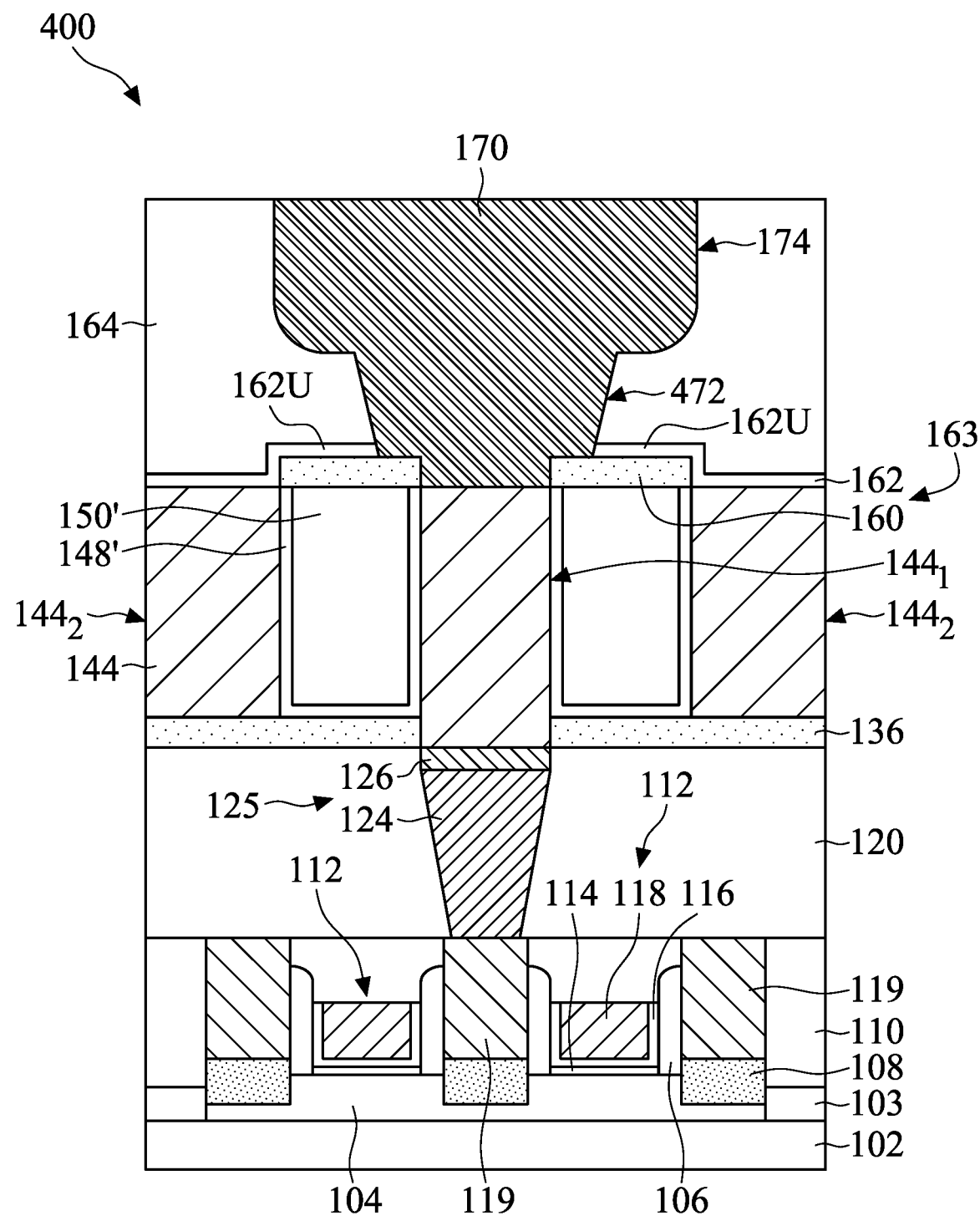

FIGS. 4A and 4B are cross-sectional views illustrating the formation of a semiconductor device at various intermediate stages, in accordance with some embodiments of the disclosure. FIGS. 4A and 4B illustrate a semiconductor structure 400 that is similar to the semiconductor structure 100 of FIGS. 1O and 1P except for a via hole 468, in accordance with some embodiments of the disclosure.

Continuing from FIG. 1N, a trench 166 and a via hole 468 are formed through the IMD layer 164, as shown in FIG. 4A, in accordance with some embodiments. In some embodiments, the via hole 468 has a width that is greater than the width of the metal line $144_1$. The via hole 468 exposes the upper surface of the metal line $144_1$, in accordance with some embodiments. The via hole 468 also exposes the upper surface of the self-aligned ESL 160, so that the self-aligned ESL 160 extends beyond an end of the horizontal upper portion 162U the conformal ESL 162 to form a step.

A metal line 174 and a via 472 are formed in the trench 166 and the via hole 468 respectively, as shown in FIG. 4B, in accordance with some embodiments. The via 472 is formed below and connects the metal line 174, in accordance with some embodiments. The via 472 contacts the metal line $144_1$, in accordance with some embodiments. The via 472 lands on the portion of the self-aligned ESL 160 extending beyond the conformal ESL 162, so that the via 472 has a step-shape, in accordance with some embodiments.

The portion of the ESL 163 along the upper surface of the IMD layer 150' is thicker than the portion of the ESL 163 along the upper surface of the metal lines 144, in accordance with some embodiments. As such, while the via hole 468 extends to and exposes the metal line $144_1$, the thicker portion of the ESL 163 may protect the IMD layer 150' adjacent to the metal line $144_1$ from damage due to the etching process. Therefore, the via critical dimension (CD) window and the TDDB window of the resulting semiconductor device may be improved, which may enhance the reliability of the resulting semiconductor device.

As described above, the method for forming an interconnect structure includes forming the self-aligned ESL 136 covering the upper ILD layer 120. The opening 137 through the self-aligned ESL 136 exposes the upper surface of the via 125. The metal bulk layer 140 is deposited over the self-aligned ESL 136 and is filled into the opening 137, followed by etching the metal bulk layer 140 to form the metal lines 144. Because the ESL 136 may function as a glue layer to adhere the metal bulk layer 140 to the upper ILD layer 120, it is not necessary to form additional conductive glue layer before forming the metal bulk layer 140. Therefore, the metal bulk layer 140' of the metal lines $144_1$ may directly contact the underlying via 125, thereby reducing the resistance of the multilayer interconnect structure, which may enhance the performance of the resulting semiconductor device.

In addition, the method for forming an interconnect structure further includes forming an etching stop layer 163 over the IMD layer 150' and the metal line 144. The portion of the ESL 163 along the upper surface of the IMD layer 150' is thicker than the portion of the ESL 163 along the upper surface of the metal lines 144. As such, the thicker portion of the ESL 163 may protect the IMD layer 150' adjacent to the metal line $144_1$ from damage due to the etching process. Therefore, the via-to-line overlay window, the via CD window, and the TDDB window of the resulting semiconductor device may be improved, which may enhance the reliability of the resulting semiconductor device.

Embodiments of a method for forming an interconnect structure are provided. The method for forming the interconnect structure may include forming a first conductive feature through the dielectric layer, forming a blocking layer on the first conductive feature, forming an etching stop layer over the dielectric layer and exposing the blocking layer, removing at least a portion of the blocking layer, forming a metal bulk layer over the etching stop layer and the first conductive feature, and etching the metal bulk layer to form a second conductive feature electrically connected to the first conductive feature. The metal bulk layer of the second conductive feature may directly contact the underlying first conductive feature, and therefore the resistance of the multilayer interconnect structure may be reduced, which may enhance the performance of the resulting semiconductor device.

In some embodiments, a method for forming an interconnect structure is provided. The method for forming the interconnect structure includes forming a first dielectric layer over a substrate, forming a first conductive feature through the first dielectric layer, forming a first blocking layer on the first conductive feature, forming a first etching stop layer over the first dielectric layer and exposing the first blocking layer, removing at least a portion of the first blocking layer, forming a first metal bulk layer over the first etching stop layer and the first conductive feature, and etching the first metal bulk layer to form a second conductive feature electrically connected to the first conductive feature.

In some embodiments, a method for forming an interconnect structure is provided. The method for forming the interconnect structure includes forming a first dielectric layer over a substrate, and forming a first via through the first dielectric layer, forming a first self-aligned etching stop layer covering the first dielectric layer. An opening through the first self-aligned etching exposes an upper surface of the first via. The method for forming the interconnect structure also includes forming a metal bulk layer covering the first self-aligned etching stop layer and filling the opening, patterning the metal bulk layer to form a metal line landing on the first via, and forming a second dielectric layer surrounding the metal line.

In some embodiments, an interconnect structure is provided. The interconnect structure includes a first interconnect layer and a second interconnect layer over the first interconnect layer. The first interconnect layer includes a first via through a first dielectric layer. The second interconnect layer includes a first self-aligned etching stop layer, a second dielectric layer over the first self-aligned etching stop layer, and a first metal line through the second dielectric layer and the first self-aligned etching stop layer and landing on the first via. The second interconnect layer also includes an encapsulating layer extending between the first self-aligned etching stop layer and the second dielectric layer and the first metal line and the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an interconnect structure, comprising:
    forming a first dielectric layer over a substrate;
    forming a first conductive feature through the first dielectric layer;
    forming a first blocking layer on the first conductive feature;
    forming a first etching stop layer over the first dielectric layer and exposing the first blocking layer, wherein the first blocking layer prevents the first etching stop layer from being formed directly above the first conductive feature;
    removing at least a portion of the first blocking layer;
    forming a first metal bulk layer over the first etching stop layer and the first conductive feature;
    etching the first metal bulk layer to form a second conductive feature electrically connected to the first conductive feature; and
    after forming the second conductive feature, forming a second dielectric layer to surround the second conductive feature.

2. The method for forming the interconnect structure as claimed in claim 1, further comprising:
    treating an upper surface of the first conductive feature before forming the first blocking layer on the first conductive feature, such that the first blocking layer is selectively formed to cover the upper surface of the first conductive feature and expose the first dielectric layer.

3. The method for forming the interconnect structure as claimed in claim 1, wherein the etching of the first metal bulk layer further forms a third conductive feature over the first etching stop layer and spaced apart from the second conductive feature.

4. The method for forming the interconnect structure as claimed in claim 3,
    wherein the second dielectric layer fills a trench between the second conductive feature and the third conductive feature.

5. The method for forming the interconnect structure as claimed in claim 4, further comprising:
    forming an encapsulating layer along the first etching stop layer, the second conductive feature, and the third conductive feature before forming the second dielectric material.

6. The method for forming the interconnect structure as claimed in claim 4, further comprising:
    forming a second etching stop layer over the second dielectric layer, the second conductive feature, and the third conductive feature,
    wherein the second etching stop layer comprises:
    a first portion extending along an upper surface of the second dielectric layer; and
    a second portion extending along an upper surface of the second conductive feature.

7. The method for forming the interconnect structure as claimed in claim 6, further comprising:
    forming a third dielectric layer over the second etching stop layer;
    etching the third dielectric layer and the second portion of the second etching stop layer to form a via hole exposing the second conductive feature; and
    filling the via hole with a second metal bulk layer.

8. The method for forming the interconnect structure as claimed in claim 7, wherein etching the third dielectric layer and the second portion of the second etching stop layer comprises partially etching the first portion of the second etching stop layer.

9. The method for forming the interconnect structure as claimed in claim 1, wherein the first conductive feature is a via and the second conductive feature is a metal line.

10. A method for forming an interconnect structure, comprising:
    forming a first dielectric layer over a substrate;
    forming a first via through the first dielectric layer;
    forming a first self-aligned etching stop layer covering the first dielectric layer, wherein an opening through the first self-aligned etching layer exposes an upper surface of the first via;
    forming a metal bulk layer covering the first self-aligned etching stop layer and filling the opening;
    patterning the metal bulk layer to form a metal line landing on the first via;
    forming a second dielectric layer surrounding the metal line;
    forming a second self-aligned etching stop layer covering the second dielectric layer;

forming a conformal etching stop layer along an upper surface and a sidewall of the second self-aligned etching stop layer and an upper surface of the metal line;

forming a third dielectric layer over the conformal etching stop layer;

etching the third dielectric layer and the conformal etching stop layer to form a via hole exposing the metal line; and forming a second via in the via hole.

11. The method for forming the interconnect structure as claimed in claim 1, wherein the first metal bulk layer is in contact with an upper surface of the first etching stop layer.

12. The method for forming the interconnect structure as claimed in claim 10, wherein:

the metal bulk layer is etched until an upper surface of the first self-aligned etching stop layer is exposed, and the first self-aligned etching stop layer is made of aluminum oxide, zirconium oxide, hafnium oxide or yttrium oxide.

13. The method for forming the interconnect structure as claimed in claim 10, further comprising:

forming a blocking layer over the metal line before forming the second self-aligned etching stop layer, wherein the blocking layer prevents the second self-aligned etching stop layer from being formed directly above the metal line.

14. The method for forming the interconnect structure as claimed in claim 13, wherein the blocking layer is an organic molecular layer including a head group and an organic tail, and the method further comprises:

after forming the second self-aligned etching stop layer, removing the organic tail of the organic molecular layer thereby leaving the head group of the organic molecular layer over the metal line.

15. A method for forming an interconnect structure, comprising:

forming a metal line over a substrate;

forming a first dielectric layer surrounding the metal line;

forming a self-aligned etching stop layer on the first dielectric layer;

forming a conformal etching stop layer along sidewalls and an upper surface of the self-aligned etching stop layer and an upper surface of the metal line;

forming a second dielectric layer over the conformal etching stop layer;

etching the second dielectric layer and conformal etching stop layer to form a via hole exposing the metal line, the self-aligned etching stop layer extends beyond an end of the conformal etching stop layer to form a step after etching the second dielectric layer and the conformal etching stop layer, wherein a portion of the conformal etching stop layer remains on the metal line.

16. The method for forming the interconnect structure as claimed in claim 15, wherein an etching selectivity of the conformal etching stop layer is different than an etching selectivity of the second dielectric layer.

17. The method for forming the interconnect structure as claimed in claim 15, further comprising:

forming a blocking layer on the upper surface of the metal line; and removing the blocking layer to expose the upper surface of the metal line after forming the self-aligned etching stop layer.

18. The method for forming the interconnect structure as claimed in claim 17, forming the metal layer before forming the first dielectric layer further comprising:

forming a lower etching stop layer over the substrate, wherein the lower etching stop layer has an opening;

forming a metal bulk layer over the lower etching stop layer and filling the opening; and etching the metal bulk layer to form the metal line, wherein a lower portion of the metal line is filled in the opening.

19. The method for forming the interconnect structure as claimed in claim 17, wherein the blocking layer has a thickness ranging from about 2 Å to about 50 Å.

20. The method for forming the interconnect structure as claimed in claim 1, further comprising:

forming a source/drain feature over the substrate; and forming a contact plug on the source/drain feature, wherein the first dielectric layer is formed over the contact plug, and the first conductive feature is electrically connected to the source/drain feature through the contact plug.

* * * * *